(12) United States Patent
Ooto et al.

(10) Patent No.: US 6,215,187 B1
(45) Date of Patent: Apr. 10, 2001

(54) SEMICONDUCTOR DEVICE AND MANUFACTURING METHOD THEREOF

(75) Inventors: Kenichi Ooto; Heiji Kobayashi; Shouitirou Nakazawa, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/400,857

(22) Filed: Sep. 21, 1999

(30) Foreign Application Priority Data

Jun. 11, 1999 (JP) .................................. 11-165897

(51) Int. Cl.$^7$ .................................................. H01L 23/48
(52) U.S. Cl. .......................... 257/758; 258/701; 258/516; 438/210
(58) Field of Search ...................... 257/758, 774, 257/701, 778, 516; 438/118, 622, 210, 329

(56) References Cited

U.S. PATENT DOCUMENTS

| 5,597,756 | 1/1997 | Fazan et al. |
| 5,658,818 | 8/1997 | Akram et al. |
| 5,936,308 | * 2/2000 | Rolfson ................................ 257/774 |
| 6,031,293 | * 2/2000 | Rolfson ................................ 257/774 |

* cited by examiner

Primary Examiner—Carl Whitehead, Jr.
Assistant Examiner—Roy Potter
(74) Attorney, Agent, or Firm—McDermott, Will & Emery

(57) ABSTRACT

A semiconductor device and manufacturing method thereof attaining higher capacitor capacitance and lower power consumption are provided. On an interlayer oxide film which is a BPTEOS film containing an impurity, an interlayer oxide film which is a TEOS film not containing any impurity is formed. Openings of approximately inverted frusto-conical shape of approximately the same size are formed in interlayer oxide films, respectively, providing a contact hole of such a shape that includes two inverted frusto-cones continued in the vertical direction as a whole is provided. Along the inner wall surface of the contact hole, a storage electrode, a dielectric film and a cell plate electrode constituting a capacitor are formed successively.

22 Claims, 23 Drawing Sheets

SEMICONDUCTOR DEVICE AND MANUFACTURING METHOD THEREOF

BACKGROUND OF THE INVENTION

1. Field of the Invention

The present invention relates to a semiconductor device and manufacturing method thereof. More specifically, the present invention relates to a semiconductor device having a capacitor and a contact plug in an MOSFET (Metal Oxide Semiconductor Field Effect Transistor), a DRAM (Dynamic Random Access Memory) or the like, and to a manufacturing method thereof.

2. Description of the Background Art

As the technique of manufacturing semiconductors and especially the technique of miniature processing have been developed, degree of integration and capacity of DRAMs for MOS transistors have been increased. As the degree of integration increases, the area occupied by a semiconductor element per 1 bit has been decreased. Therefore, the area of a capacitor storing information (charges) decreases, and hence charges stored therein decreases. As a result, the capacitor has come to be very sensitive to slight electrical influence, so that there have been problems of erroneous calling of information where charges are erroneously injected to the capacitor or charges are erroneously ejected from the capacitor, as well as the problem of soft error in which the contents of the memory is destroyed by α ray or the like. Further, as the semiconductor device has been reduced in size, contact area between a transistor and an interconnection or a contact area of a contact plug connecting interconnections with each other is reduced, so that contact resistance at the content portion is increased. This means that excessive voltage is required in a highly miniaturized semiconductor devices and that power consumption increases.

In order to address one of the aforementioned problems, that is, reduction of capacitor capacitance resulting from miniaturization of the semiconductor devices, various methods have been proposed to increase area of occupation in a capacitor using a polycrystalline silicon film or the like for the storage electrode. According to one of the proposed methods, the storage electrode is formed in a cylindrical shape, so as to increase contact area in a direction vertical to the main surface of the semiconductor substrate.

The structure of a conventional cylindrical capacitor and manufacturing method thereof will be described with reference to FIGS. 22 to 28. First, on a P type silicon substrate 102, an isolating oxide film 105a is formed, resulting in separate element forming regions. On the element forming region formed separately by isolating oxide film 105a, a gate oxide film 104c and a gate electrode 104 (word line) of a two-layered structure including a high melting point metal silicide film 104a and a polycrystalline silicon film 104b are formed. Thereafter, using gate electrode 104 as a mask, source/drain regions 103, which are n⁻ diffusion layers, are formed by impurity implantation. In this manner, an MOSFET, that is, an MOS field effect transistor is formed. Thereafter, to cover gate electrode 104 and isolating oxide film 105a, an interlayer oxide film 105b is deposited on semiconductor substrate 102. Thereafter, a contact hole 106a is formed to be connected to source/drain region 103. Thereafter, a contact plug is filled in contact hole 106a, and etched to a prescribed shape. Thus, a bit line 106 connected to the MOS field effect transistor is formed as shown in FIG. 22. Then, an interlayer oxide film 105c is deposited on interlayer oxide film 105b, and a contact hole 107a for forming a plug establishing electrical connection between source/drain region 103 and a storage electrode of the capacitor is formed. Thereafter, a conductive material is filled in contact hole 107a, so that a contact plug 107 is formed. Thereafter, an interlayer oxide film 105j is deposited on interlayer oxide film 105c and contact plug 107. On interlayer oxide film 105j, a prescribed mask is formed, and thereafter, a contact hole 150 in which a capacitor is to be formed, is formed by etching as shown in FIG. 24. Thereafter, a polycrystalline silicon film, which is to be storage electrodes 108a and 108b, is formed in contact hole 150. Thereafter, a capacitor dielectric film 101 is formed to cover an upper surface of interlayer oxide film 105j and surfaces of storage electrodes 108a and 108b. Thereafter, a film which is to be a cell plate electrode 109, is deposited to cover capacitor dielectric film 101, and in this manner, the capacitor is completed.

As the two-dimensional area of semiconductor substrate 102 occupied by the semiconductor device decreases, the capacitor formed through the above described steps has come to be formed extending considerably large in the vertical direction with respect to semiconductor substrate 102. In other words, contact hole 105 in which the capacitor is formed is large in the vertical direction with respect to the main surface of semiconductor substrate 102.

Therefore, generally, contact hole 150 in which storage electrode 109 is formed has an upper portion of interlayer oxide film 105j etched by larger amount than the lower portion through dry etching as can be seen from FIG. 25, and therefore the contact hole come to have an inverted frusto-conical shape with inclined sidewalls, of which opening diameter gradually increases from the lower portion to the upper portion of interlayer oxide film 105j. Therefore, when a two-dimensionally small contact hole 150 is to be formed, the lower portion of contact hole 150 come to have too small an opening diameter relative to the upper portion. As a result, at the lower portion of contact hole 150, the conductive material for forming the film to be the storage electrode 109 may not be sufficiently filled but clogged.

If the conductive material for forming the film to be cell plate electrode 109 is not properly filled in the lower portion of contact hole 150, surface area of that portion which functions as an electrode of cell plate electrode 109 reduces, resulting in reduced electrostatic capacitance of the capacitor. Even when the conductive material for forming the film to be cell plate electrode 109 is properly filled, cell plate electrode 109 becomes very thin at the lower portion of contact hole 105, and therefore it becomes difficult to store sufficient charges. Thus the function of the cell plate electrode cannot be ensured.

Further, the higher the height of the capacitor from the main surface of semiconductor substrate 102, contact hole 150 come to have the higher aspect ratio.

Here, as the sidewalls of contact hole 150 are inclined, the opening diameter is small at the lower portion of contact hole 150, and further, a phenomenon referred to as bowing, where the opening diameter at the upper portion of contact hole 150 come to be smaller than the middle portion of contact hole 150, is observed. When the phenomenon of bowing occurs in contact hole 150, a material 170 formed along contact hole 150 provided in interlayer oxide film 105k cannot be properly filled, resulting in undesirable void inside the material 170.

Further, problems experienced in contact plug 107 will be described with reference to FIGS. 27 and 28. FIG. 27 is a cross section taken along the line B—B of FIG. 23. As can be seen from FIG. 27, contact plug 107 is required of a small opening diameter at an upper portion of contact hole 107a, considering short-circuit with bit line 106. Therefore, when the contact hole is formed in the frusto-conical shape in a two dimensionally small semiconductor device as described above, the opening diameter at the lower portion becomes considerably small. Accordingly, the contact resistance at the contact between the lower surface of conductive contact plug filled in contact hole 107a and source/drain region 103 is high. Further, as can be seen from FIG. 28, when the opening diameter of contact hole 107a is enlarged by wet etching to reduce contact resistance to provide contact hole 107b, there will be an increased possibility of short-circuit between bit line 106 and the contact plug formed along contact hole 107b.

SUMMARY OF THE INVENTION

Therefore, an object of the present invention is to provide a semiconductor device attaining larger capacitance of a capacitor and lower power consumption, and to provide manufacturing method thereof.

The semiconductor device in accordance with the present invention includes a semiconductor substrate, and an insulating film containing an impurity formed on the semiconductor substrate, of which impurity concentration distribution is set such that average isotropical etch rate from a lower surface to a prescribed portion near the lower surface is higher than average isotropic etch rate from an upper surface to a prescribed position near the upper surface under a prescribed etch condition.

By such a structure, it becomes possible when, for example, an opening diameter of a frusto-conical contact hole formed by dry etching through an insulating film is to be enlarged by isotropic wet etching, to set etch rate of the insulating film in a direction approximately parallel to the main surface of the semiconductor substrate to be gradually lowered as it goes away from the main surface of the semiconductor substrate, by providing an insulating film of which impurity concentration is gradually made lower as it goes away from the main surface of the semiconductor substrate. Accordingly, it becomes possible to gradually enlarge the opening diameter of the contact hole nearer to the semiconductor substrate. As a result, it becomes possible to form an approximately columnar contact hole.

Therefore, when a capacitor is formed in the contact hole which is opened in approximately columnar shape as described above, the unsatisfactory filling of the film for forming the capacitor due to the narrowed portion near the semiconductor substrate can be prevented. Accordingly, decrease in capacitor capacitance resulting from increased resistance at the capacitor lower portion caused by unsatisfactory filling can be avoided. Thus, capacitor capacitance is improved. Therefore, for the same two-dimensional occupational area parallel to the main surface of the semiconductor substrate, the capacitor capacitance can be increased, and hence malfunction of the capacitor such as a soft error is suppressed. This means that a capacitor which operates correctly with small occupation area is provided, enabling miniaturization of the semiconductor device.

Further, it is possible to avoid enlarging of the opening diameter at a portion where the contact plug contacts other conductive layer, when the contact plug is formed in the contact hole opened in the approximately columnar shape as mentioned above. The contact area between the contact plug and other conductive layer is increased so that increase in contact resistance of the contact plug is suppressed, and therefore power consumption of the semiconductor device can be reduced.

According to the present invention, the insulating film may include a first insulating film having a first impurity, and a second insulating film formed on the first insulating film and having a second impurity at a lower impurity concentration than the impurity concentration of the first insulating film.

In such a structure, the impurity concentration of the first insulating film is adapted to be higher than the impurity concentration of the second insulating film, and therefore during wet etching, the first insulating film is etched by larger amount than the second insulating film. Accordingly, when the opening diameter of the contact hole formed through the first and second insulating films is to be enlarged by wet etching, it is possible to make larger the opening in the first insulating film than in the second insulating film. As a result, from the same reason as described with respect to the semiconductor device according to the above described aspect of the present invention, a capacitor which operates correctly with small occupation area can be formed, and the contact resistance can be reduced. Thus, the semiconductor device can be miniaturized and power consumption thereof can be reduced.

According to another aspect, the semiconductor device may further include a third insulating film formed on the second insulating film and having a third impurity having still higher impurity concentration than the second insulating film.

In such a structure, as the impurity concentration of the third insulating film is adapted to be higher than the impurity concentration of the second insulating film, in the step of enlarging the opening diameter of the insulating film by wet etching, the etch rate of the third insulating film is higher than the etch rate of the second insulating film. Therefore, it is possible to prevent unsatisfactory filling of the conductive material filled in the contact hole when, for example, the opening of the contact hole formed in the insulating film becomes smaller near the upper portion of the contact hole because of the influence of heat treatment or the like. Thus, increase in contact resistance of the contact plug caused by unsatisfactory filling of the contact plug can be suppressed, and hence power consumption of the semiconductor device can be reduced.

According to a still further aspect, in the semiconductor device in accordance with the present invention, the impurity concentration of the insulating film may be adapted to be gradually lower away from the semiconductor substrate. In such a structure, the insulating film contains larger amount of impurity closer to the semiconductor substrate, and therefore during wet etching, the closer to the semiconductor substrate, by the greater amount the insulating film is etched. Therefore, from the same reasons as described with respect to the semiconductor device according to the first aspect described above, a capacitor which operates correctly with small occupation area can be formed, and the contact resistance can be reduced. Therefore, the semiconductor device can be miniaturized and power consumption thereof can be reduced.

According to still another aspect, in the semiconductor device in accordance with the present invention, the impurity may include at least one of boron and phosphorous.

Such a structure enables variation of etching rate when the insulating film is wet-etched, when a BPTEOS (Boro Phospho Tetra Etyle Ortho Silicate) film, a PSG (Phospho Silicate Glass) film or the like is formed as the insulating film.

Preferably, in the semiconductor device in accordance with the present invention, a hole penetrating the insulating film is formed in the insulating film.

In this structure, the contact hole is used as a space for forming a capacitor or a space for forming the contact plug, and hence the effects of miniaturization of the semiconductor device and reduction of power consumption thereof can be attained.

According to a still further aspect of the present invention, in the semiconductor device in accordance with the present invention, a capacitor may be formed along an inner peripheral surface of the hole.

In this structure, the contact hole is used as a space for forming the capacitor, and hence the effect of miniaturizing the semiconductor device as mentioned above can be attained.

Further, in the semiconductor device in accordance with the present invention, a contact plug may be formed to fill the hole.

In this structure, the contact hole is used as a space for forming the contact plug, and thus the aforementioned effect of reducing power consumption of the semiconductor device, mentioned above, can be attained.

According to a still another aspect of the present invention, the method of manufacturing a semiconductor device includes the step of forming an insulating film of which impurity concentration distribution is set such that average isotropic etch rate from a lower surface to a position near the lower surface is higher than average isotropic etch rate from an upper surface to a position close to the upper surface under a prescribed etching condition, on a semiconductor substrate.

By such a manufacturing method, it becomes possible when, for example, an opening diameter of a frusto-conical contact hole formed penetrating through an insulating film by dry etching is to be enlarged by isotropic wet etching, to provide an insulating film of which etch rate in a direction approximately parallel to the main surface of the semiconductor substrate is gradually decreased as it goes away from the main surface of the semiconductor substrate, by setting the impurity concentration gradually lower as it goes away from the main surface of the semiconductor substrate. Therefore, an insulating film of which opening diameter is gradually enlarged nearer to the semiconductor substrate can be formed. As a result, an insulating film having a contact hole opened in an approximately columnar shape can be formed.

Therefore, an insulating film can be formed, without enlarging the opening diameter at the upper portion of the insulating film, which can prevent unsatisfactory filling of the film for forming the capacitor caused by narrowed portion near the semiconductor substrate, when a capacitor is formed in the contact hole opened in the approximately columnar shape as described above. Therefore, a capacitor which is free from the problem of decreased capacitance caused by increased resistance at the capacitor lower portion resulting from the unsatisfactory filling, can be formed not in the two-dimensionally large structure as conventionally formed by significantly enlarging the opening diameter of the upper portion of the insulating film. Therefore, for the same occupation area in a plane parallel to the main surface of the semiconductor substrate, the capacitor capacitance can be increased, and malfunction such as a soft error can be suppressed though the capacitor is small. As a result, a capacitor which operates correctly with small area of occupation can be formed, enabling miniaturization of the semiconductor device.

Further, when a contact plug, for example, is formed in the contact hole opened in the approximately columnar shape as described above, it is possible to enlarge the opening diameter at a portion where the contact plug contacts other conductive layer. Thus, as the contact area between the contact plug and other conductive layer is enlarged, increase in contact resistance at a lower portion of the contact plug can be suppressed, and a semiconductor device having low power consumption can be provided.

According to another aspect, in the method of manufacturing a semiconductor device of the present invention, the step of forming the insulating film may include the step of forming a first insulating film having a first impurity on the semiconductor substrate, and the step of forming a second insulating film having a second impurity of higher impurity concentration than the first insulating film, on the first insulating film.

By such a method of manufacturing, it is possible to set the impurity concentration of the first insulating film higher than the impurity concentration of the second insulating film. Therefore, in the subsequent step of wet etching, the first insulating film is etched by larger amount than the second insulating film. Therefore, when the opening diameter of the contact hole formed in the first and second insulating films is to be enlarged by wet etching, an insulating film is provided in which the opening diameter of the first insulating film only is enlarged. As a result, from the same reasons as described with respect to the manufacturing method of the semiconductor device according to the above described aspect, a capacitor which operates correctly with small area of occupation can be formed, and in addition, as the contact resistance is reduced, a semiconductor device which is miniaturized and consumes less power can be obtained.

In the method of manufacturing a semiconductor device in accordance with the present invention, the step of forming an insulating film may further include the step of forming a third insulating film having a third impurity of higher impurity concentration than the second insulating film, on the second insulating film.

When the manufacturing method is used, as the concentration of the third impurity is set higher than the concentration of the second impurity, the etch rate of the third insulating film is higher than the etch rate of the second insulating film, when the opening diameter of the contact hole is to be enlarged by wet etching. Therefore, when the opening diameter of an upper portion of the contact hole formed in the insulating film is reduced in size by heat treatment or the like, for example, unsatisfactory filling of the conductive material filled in the contact hole can be prevented. Therefore, increase in contact plug resistance derived from the unsatisfactory filling is suppressed, and hence a semiconductor device which consumes less power can be obtained.

In the method of manufacturing a semiconductor device in accordance with the present invention, the method of forming an insulating film may include the step of adding an impurity such that impurity concentration gradually lowers as it goes away from the semiconductor substrate.

By using such a manufacturing method, it becomes possible to form an insulating film which is etched by larger amount nearer to the semiconductor substrate, during wet etching. Therefore, from the same reasons as described with respect to the semiconductor device above, a capacitor is formed which operates correctly while occupying a small area, and hence a miniaturized semiconductor device can be provided.

In the method of manufacturing a semiconductor device in accordance with the present invention, the impurity may include one or more materials selected from the group consisting of boron and phosphorus.

By using such a manufacturing method, it becomes possible to vary the rate of wet etching when a BPTEOS film, a PSG film or the like is formed as the insulating film, and therefore a semiconductor device realizing the above described effects can be provided.

Preferably, the method of manufacturing a semiconductor device in accordance with the present invention further includes the step of forming a hole penetrating the insulating film, in the insulating film.

By using such a manufacturing method, the contact hole is utilized as a space for forming a capacitor or a space for forming a contact plug, and thus the semiconductor device which is miniaturized and consumes less power as described above, can be provided.

The method of manufacturing a semiconductor device in accordance with the present invention may preferably include the step of forming a capacitor along a sidewall of the hole.

By using such a manufacturing method, the contact hole is utilized as a space for forming the capacitor, and hence the miniaturized semiconductor device as described above can be provided.

Further, the method of manufacturing a semiconductor device in accordance with the present invention may further include the step of forming a contact plug to fill the hole.

By using such a manufacturing method, the contact hole may be utilized as a space for forming a contact plug, and hence the semiconductor device which consumes less power as described above can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
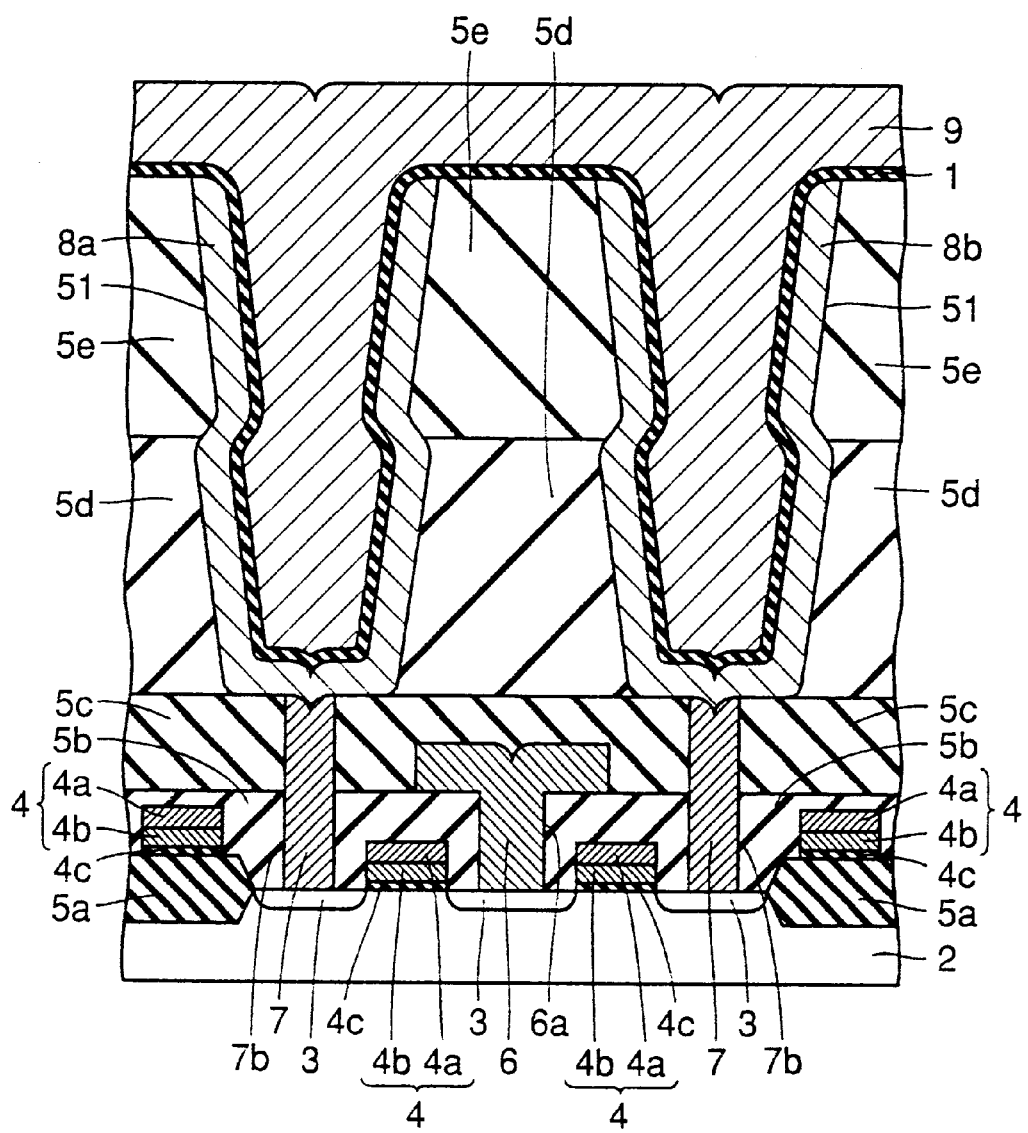
FIG. 1 is a cross section view representing a structure of a semiconductor device in accordance with a first embodiment of the present invention.

Embodiments of the present invention will be described in the following with reference to the figures.

First Embodiment

The structure and the method of manufacturing a semiconductor device in accordance with the first embodiment of the present invention will be described with reference to FIGS. 1 to 9. The structure of the semiconductor device in accordance with the present embodiment will be described first, with reference to FIG. 1. In the semiconductor device in accordance with the present embodiment, an isolating oxide film 5a for isolating element forming regions is formed on a P type silicon substrate 2. On each of the element forming regions separated by isolating oxide film 5a, a gate electrode 4 (word line) including a gate oxide film 4c and a two-layered structure of a high melting point metal silicide film 4a and a polycrystalline silicon film 4b is formed. On both sides of gate electrode 4, source/drain regions 3, which are n⁻ diffusion layers, are formed, thus providing an MOSFET, that is, an MOS field effect transistor.

To cover gate electrode 4, source/drain region 3 and isolating oxide film 5a, an interlayer oxide film 5b is formed on semiconductor substrate 2. In interlayer oxide film 5b, a contact hole 6a is formed to reach the central source/drain region 3. A contact plug is filled in contact hole 6a, and a bit line 6 connected to the MOS field effect transistor etched to a prescribed shape is formed.

An interlayer oxide film 5c is formed on interlayer oxide film 5b, and a contact hole 7b in which a contact plug to be electrically connected to a storage electrode of a capacitor is formed penetrating through the interlayer oxide films 5b and 5c. A conductive material is filled in contact hole 7b, thus providing a contact plug 7. Further, interlayer oxide film 5d which is a BPTEOS film, is formed on interlayer oxide film 5c. On interlayer oxide film 5d, an interlayer oxide film 5e which is a TEOS film almost free of any impurity, is formed on interlayer oxide film 5d. A contact hole 51 having two inverted frusto-cones connected in vertical direction, in which the capacitor is to be formed, is formed penetrating through interlayer oxide films 5d and 5e, respectively.

Along the inner wall of contact hole 51, a polycrystalline silicon film, which is to be storage electrodes 8a and 8b, is formed. To cover surfaces of storage electrodes 8a and 8b and an upper surface of interlayer oxide film 5e, a capacitor dielectric film 1 is formed. To cover the surface of capacitor dielectric film 1, a cell plate electrode 9 is formed, and a capacitor in the shape of two inverted frusto-cones continued in vertical direction is formed.

In this structure, on interlayer oxide film d containing boron and phosphorus as impurities, interlayer oxide film 5e almost free of any impurity such as phosphorus or boron is formed. Therefore, isotropic wet etch rate of interlayer oxide film 5d is higher than isotropic wet etch rate of interlayer oxide film 5e. Therefore, when contact hole 50 formed to penetrate interlayer oxide films 5d and 5e is to be enlarged in its opening diameter by wet etching, for example, it is possible to enlarge the opening diameter of interlayer oxide film 5d by larger amount than interlayer oxide film 5e. The contact hole formed penetrating through interlayer oxide films 5d and 5e by dry etching generally has an inverted frusto-conical shape with the opening diameter of interlayer oxide film 5d being smaller than the opening diameter of interlayer oxide film 5e. In the semiconductor device in accordance with the present embodiment, however, the opening diameter of interlayer oxide film 5d is enlarged to be larger than the opening diameter of interlayer oxide film 5e, as described above. Therefore, it is possible to form contact hole 51 in which the capacitor is formed in a shape having approximately identical two inverted frusto-cones continued in the vertical direction.

Therefore, in the semiconductor device in accordance with the present embodiment in which the capacitor is formed in the contact hole 51 opened in such a shape in that two inverted frusto-cones are continued in the vertical direction as described above, unsatisfactory filling of film constituting the capacitor, caused by the narrowing of the portion of contact hole closer to the semiconductor substrate 1, that is, narrowing of the lower portion of interlayer oxide film 5d, can be prevented. Accordingly, lowering in capacitor capacitance resulting from the unsatisfactory filling can be suppressed, and hence the capacitor capacitance can be improved. Therefore, it becomes possible to increase the capacitor capacitance with the same occupation area in a plane parallel to the main surface of the semiconductor substrate, and therefore malfunction of the capacitor such as a soft error can be suppressed. As a result, a capacitor operating correctly with small occupation area is formed, and thus it becomes possible to miniaturize the semiconductor device.

Figure 2:
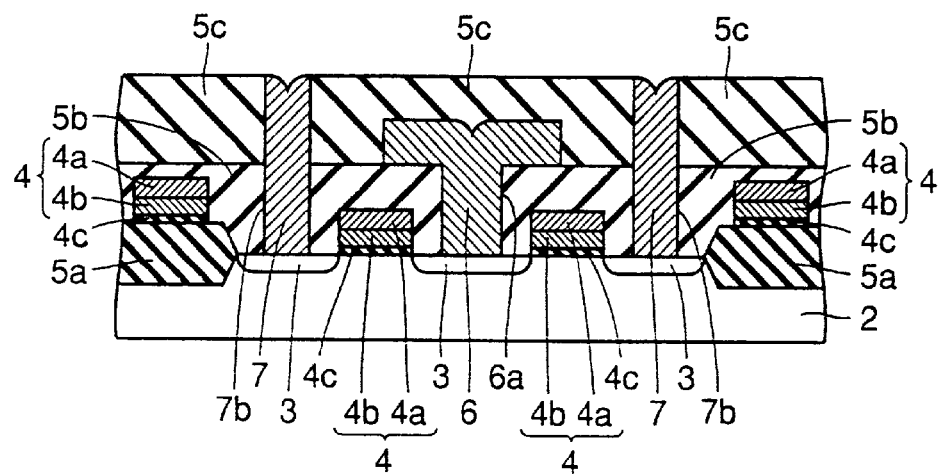
FIG. 2 is a cross sectional view showing a state immediately after a contact plug to be connected to source/drain region filling a contact hole formed in an interlayer oxide film is formed, in the method of manufacturing a semiconductor device in accordance with the first embodiment of the present invention.
Figure 3:
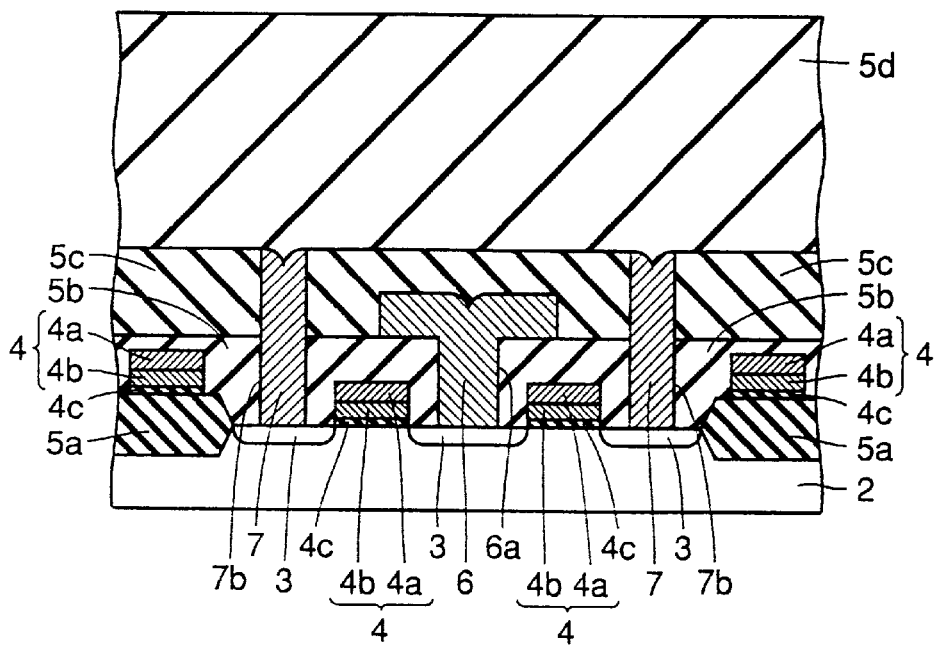
FIG. 3 is a cross sectional view showing a state immediately after a lower interlayer oxide film is formed for forming a capacitor to cover the surface of the interlayer oxide film in which the contact plug is formed, in the method of manufacturing a semiconductor device in accordance with the first embodiment of the present invention.
Figure 4:
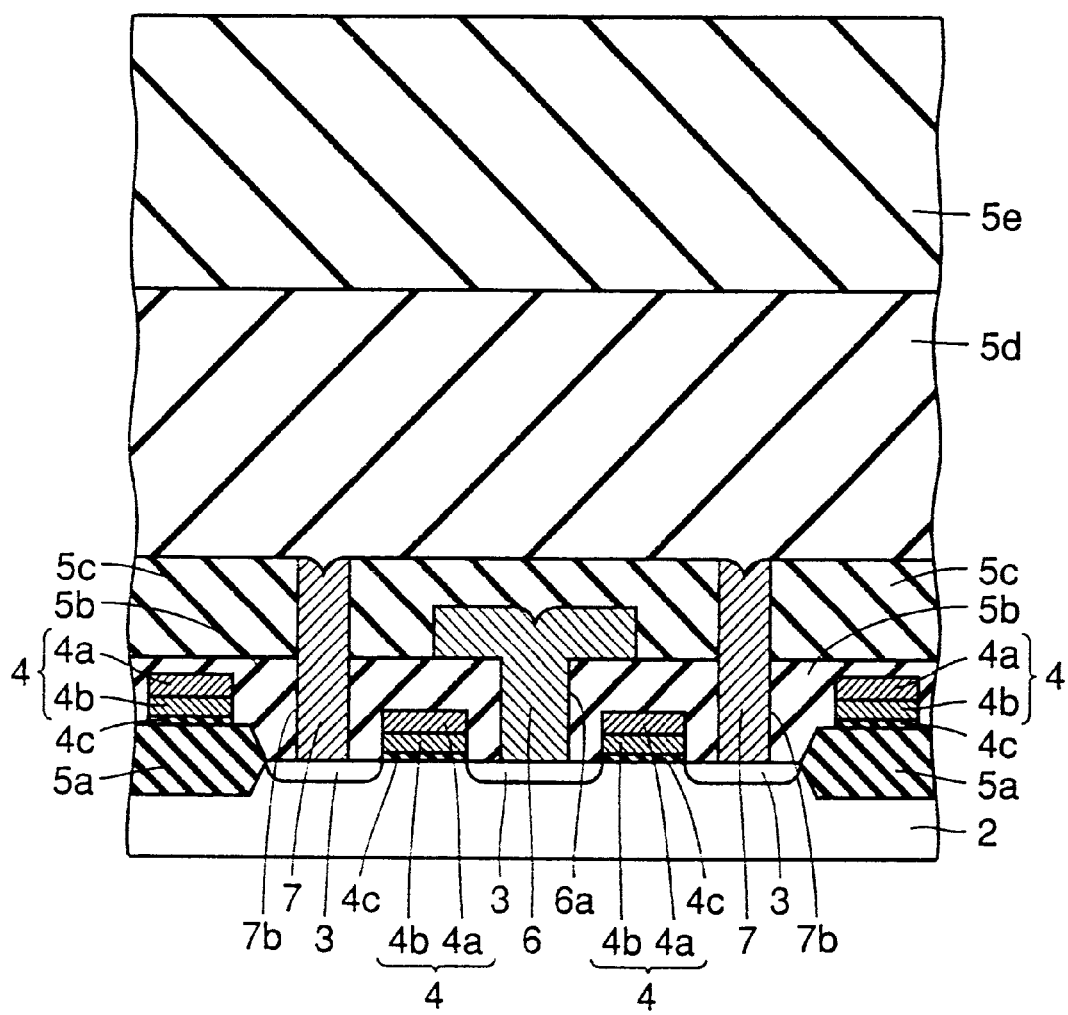
FIG. 4 is a cross sectional view showing a state immediately after an upper interlayer oxide film is formed on the lower interlayer oxide film, for forming the capacitor, in the method of manufacturing a semiconductor device in accordance with the first embodiment of the present invention.
Figure 5:
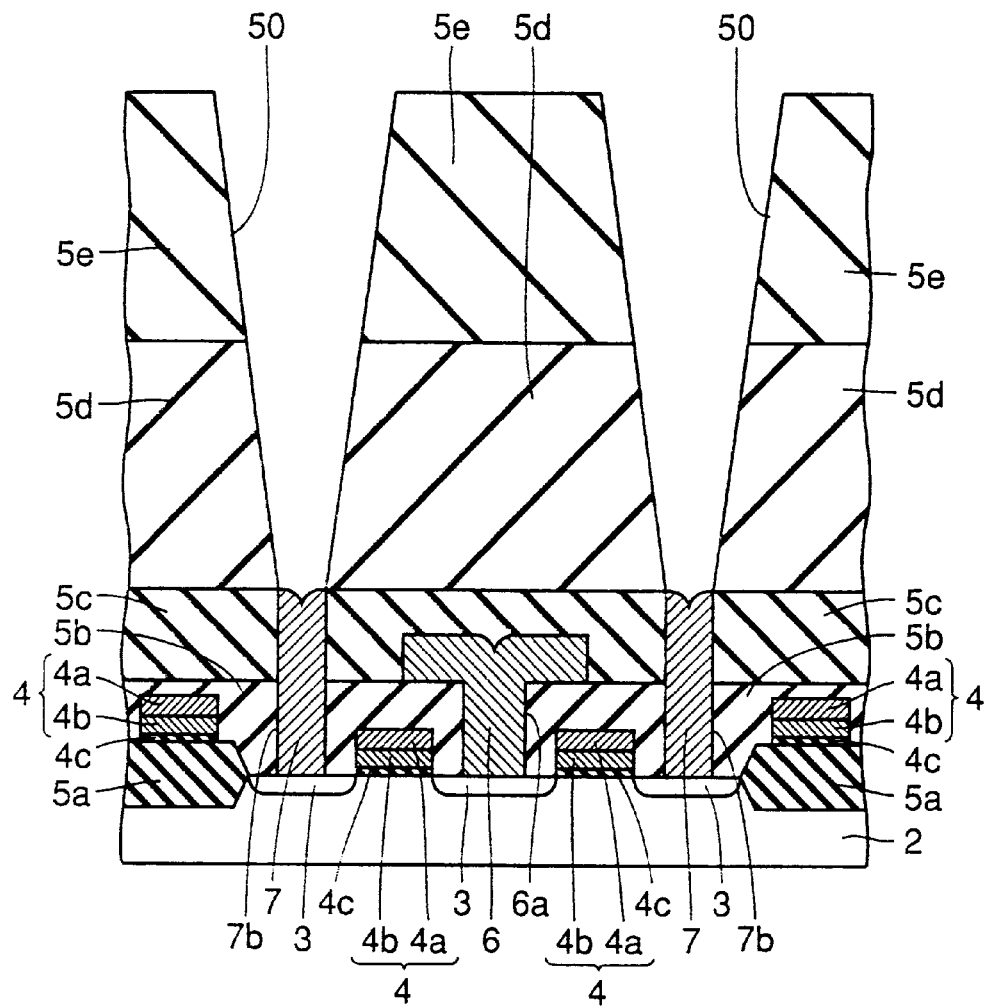
FIG. 5 is a cross sectional view showing a state immediately after a frusto-conical contact hole penetrating through the upper and lower interlayer oxide films is formed toward the contact plug by dry etching, in the method of manufacturing a semiconductor device in accordance with the first embodiment of the present invention.

The method of manufacturing a semiconductor device in accordance with the present embodiment will be described with reference to FIGS. 2 to 9. In FIG. 2, the steps until contact plug 7 is formed are approximately the same as those of the method of manufacturing a semiconductor device described with reference to the prior art, except that the contact hole 7b is formed in an approximately vertical columnar shape with respect to the main surface of semiconductor substrate 2. Thereafter, referring to FIG. 3, contact plug 7 and interlayer oxide film 5d having the thickness of about 500 nm of BPTEOS are deposited. Thereafter, referring to FIG. 4, on interlayer oxide film 5d, interlayer oxide film 5e having the thickness of about 300 nm of TEOS is deposited. Thereafter, by photolithography and etching, a photoresist film having a hole shape is formed by patterning, to provide a storage electrode. Using the photoresist film as a mask, contact hole 50 is formed by reactive ion etching, to expose the surface of contact plug 7, as shown in FIG. 5.

Figure 6:
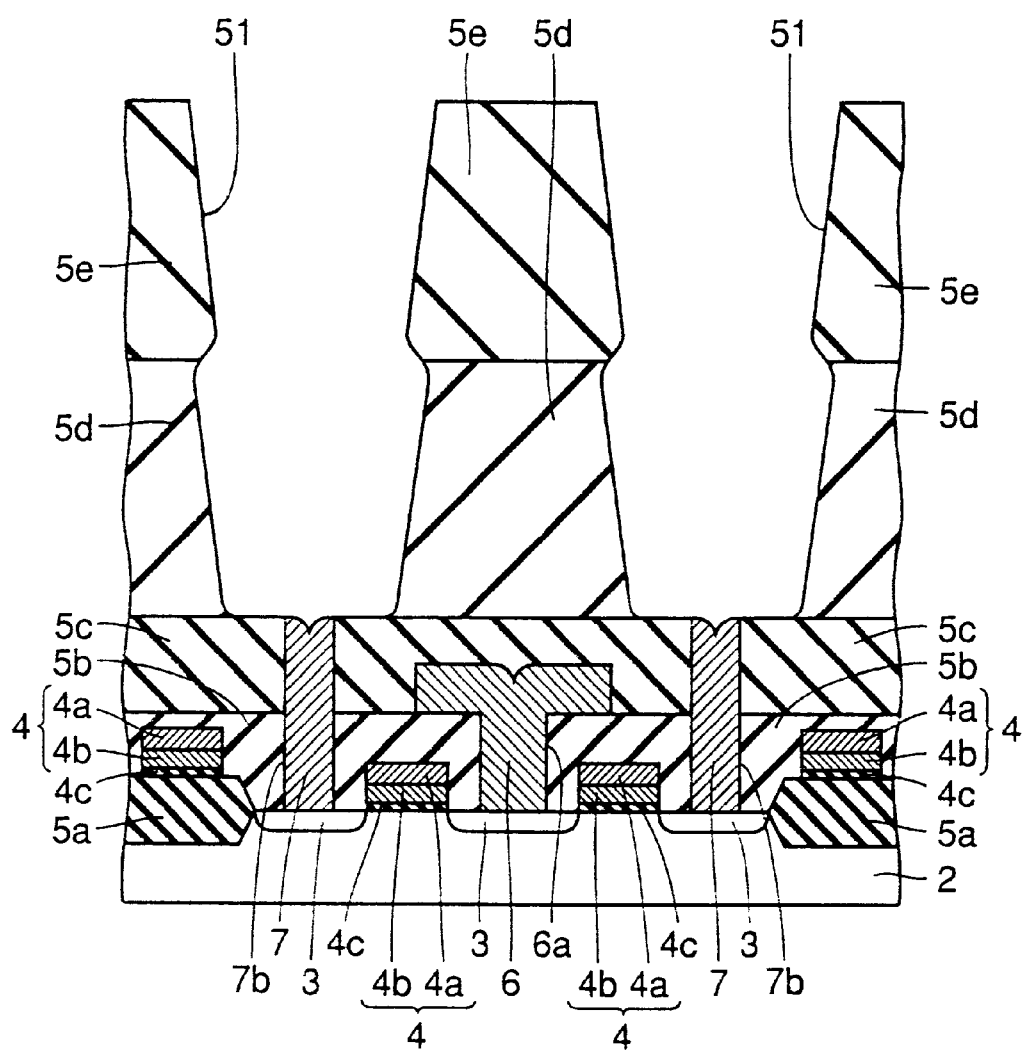
FIG. 6 is a cross sectional view showing a state immediately after a contact hole having two frusto-cones continued in vertical direction is formed by significantly enlarging opening diameter of a contact hole formed in the lower interlayer oxide film in a direction horizontal to the semiconductor substrate by wet etching, in the method of manufacturing a semiconductor device in accordance with the first embodiment of the present invention.

Thereafter, in order to enlarge contact hole 50, the sidewall of contact hole 50 is isotropically wet-etched, using buffered hydrofluoric acid. At this time, the wet etch rate of BPTEOS, that is, interlayer oxide film 5d is about 35 nm/min, while wet etch rate of TEOS, that is, interlayer oxide film 5e, is about 16 nm/min. Therefore, interlayer oxide film 5d is etched by larger amount than interlayer oxide film 5e, so that contact hole 51 comes to have such a shape that has two inverted frusto-cones continued in the vertical direction, as shown in FIG. 6.

Figure 7:
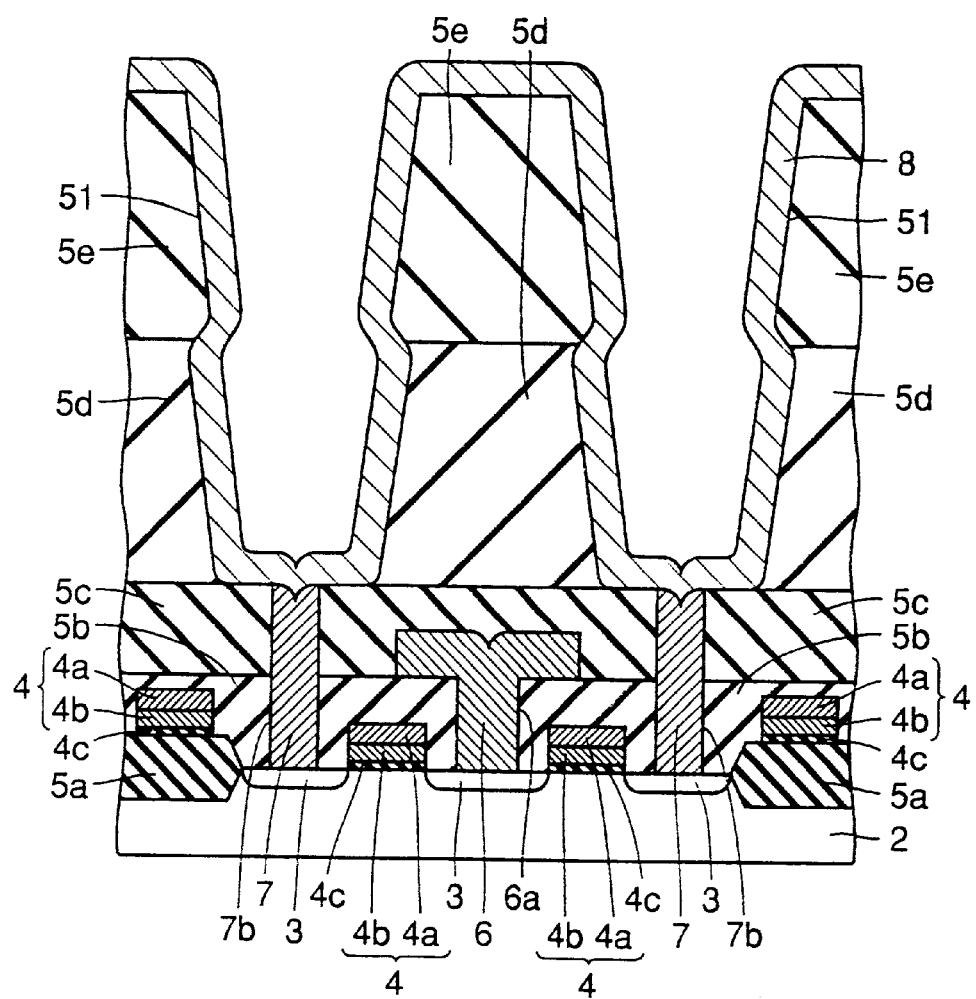
FIG. 7 is a cross sectional view showing a state immediately after a conductive layer to be a storage electrode is formed on a sidewall of the contact hole formed in the interlayer oxide film to form a capacitor, in the method of manufacturing a semiconductor device in accordance with the first embodiment of the present invention.
Figure 8:
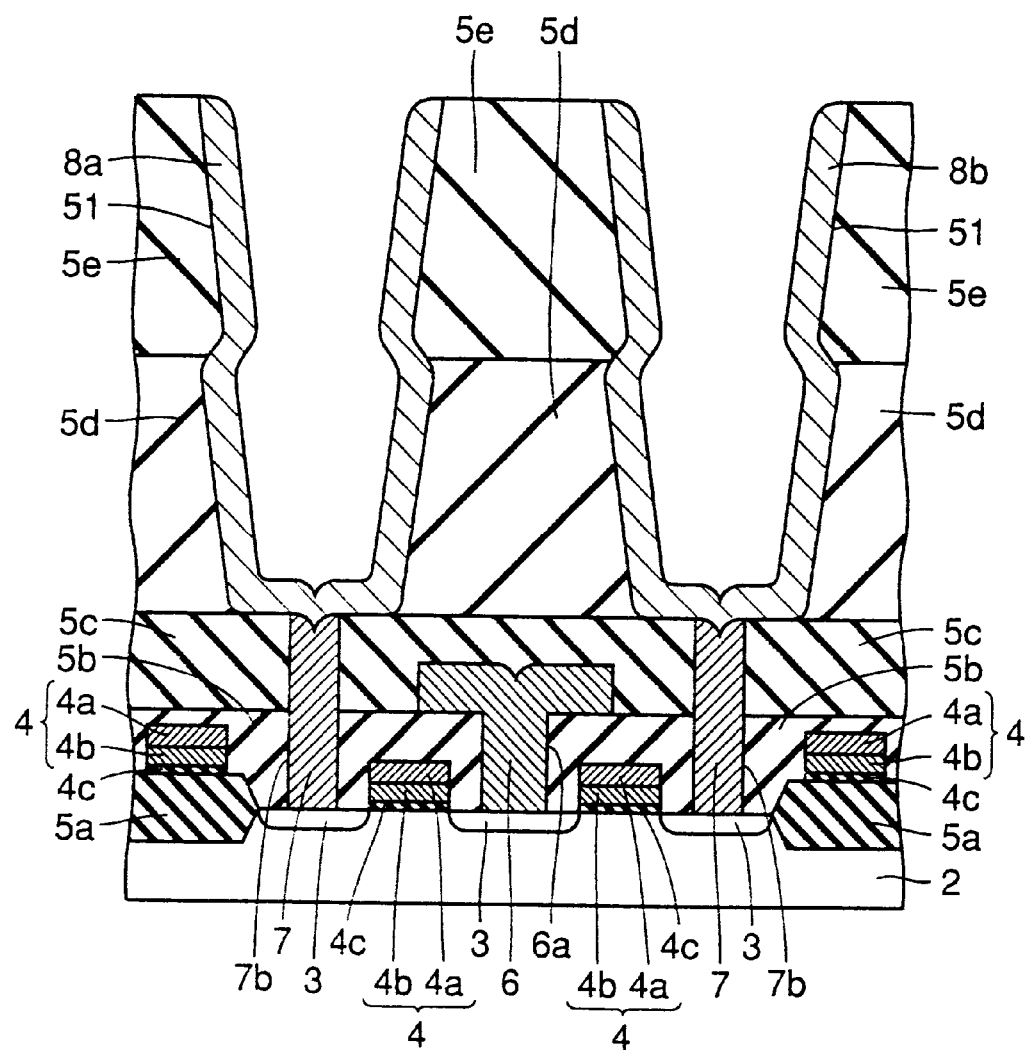
FIG. 8 is a cross sectional view showing a state immediately after an unnecessary conductive layer formed on the interlayer oxide film for forming a capacitor is removed, in the method of manufacturing a semiconductor device in accordance with the first embodiment of the present invention.
Figure 9:
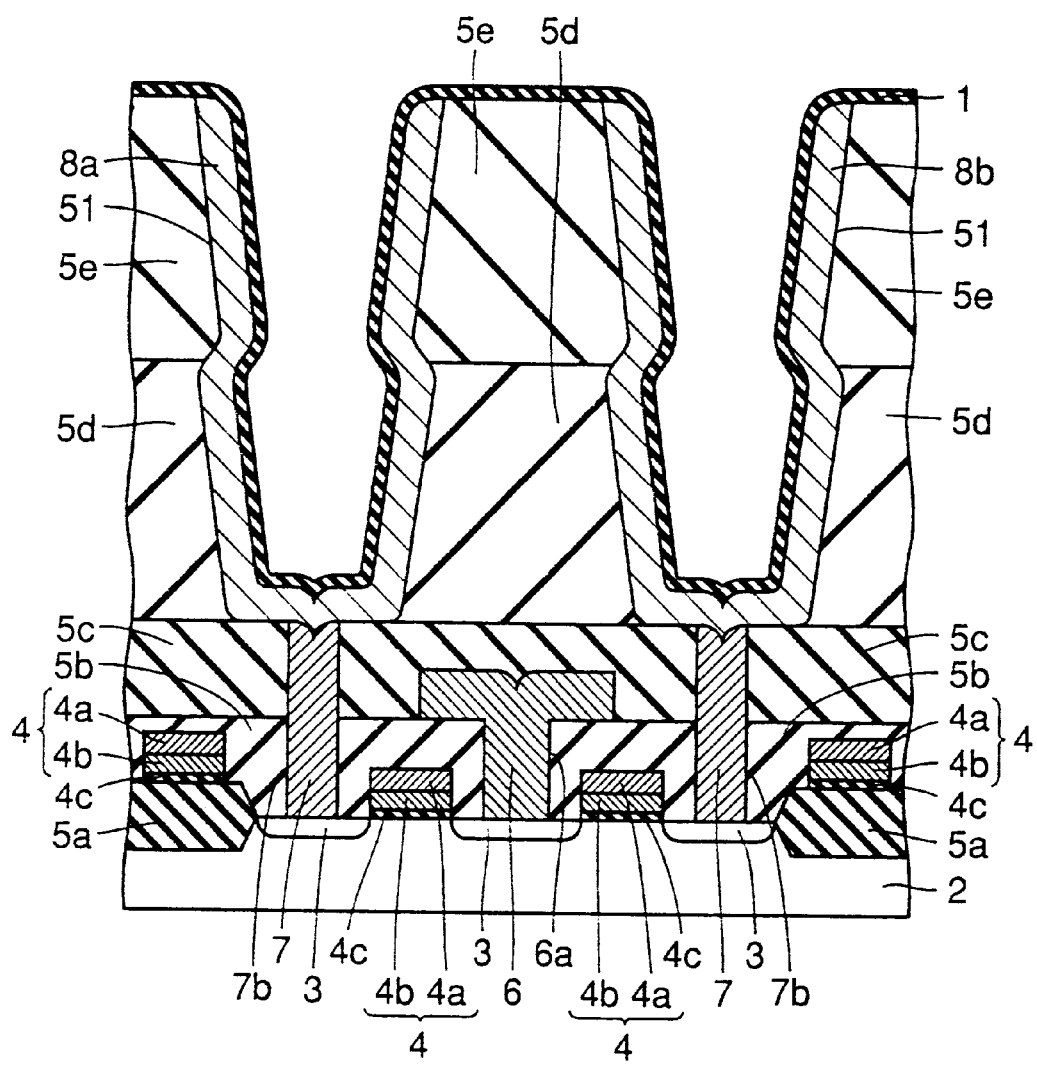
FIG. 9 is a cross sectional view showing a state immediately after a dielectric layer is formed to cover the surface of the conductive layer to be the storage electrode and the upper surface of the interlayer oxide film, in the method of manufacturing a semiconductor device in accordance with the first embodiment of the present invention.

Then, referring to FIG. 7, after the enlarge contact hole 50 is formed, a polycrystalline silicon film 8 doped with phosphorus, which will be the storage electrode, is deposited to cover the surface of contact hole 51 and upper surface of interlayer oxide film 5e. Thereafter, a resist film or the like is filled in the hole formed by polycrystalline silicon film 8, which will be the storage electrode in advance, to prevent damage to the bottom portion of the storage electrode by reactive ion etching. Thereafter, polycrystalline silicon film 8 deposited on the upper surface of interlayer oxide film 5e is removed by reactive ion etching as shown in FIG. 8, the resist film in the hole is removed, and storage electrodes 8a and 8b are formed. Thereafter, referring to FIG. 9, a capacitor dielectric film 1 is deposited to cover storage electrodes 8a and 8b and interlayer oxide film 5e. Thereafter, referring to FIG. 1, a cell plate electrode 9 formed of polycrystalline silicon film doped with phosphorus is deposited to cover the surface of capacitor dielectric film 1. In this manner, a semiconductor device having a capacitor is completed.

As interlayer oxide film 5e not including any impurity is formed on interlayer oxide film 5d containing phosphorus and boron as impurities by such a manufacturing method, it is possible to set the etch rate of interlayer oxide film 5d higher than the etch rate of interlayer oxide film 5e. Accordingly, in the method of manufacturing a semiconductor device in accordance with the present embodiment in which opening diameter of contact hole 50 formed to penetrate interlayer oxide films 5d and 5e continuously in the shape of inverted frusto-cones by dry etching is further enlarged by wet etching, it is possible to enlarge the opening diameter of interlayer oxide film 5d larger than the opening diameter of interlayer oxide film 5e. Therefore, a contact hole 51 having two inverted frusto-cones continued in the vertical direction with the opening diameter of interlayer oxide film 5d only is enlarged wide can be formed.

Therefore, when the capacitor is formed in contact hole 51 which has two inverted frusto-cones continued in the vertical direction, a capacitor is formed in which unsatisfactory filling caused by narrower opening diameter of interlayer oxide film 5d closer to the semiconductor substrate 2 as compared with the opening diameter of interlayer oxide film 5e, can be prevented.

Therefore, a capacitor can be formed in which lowering of electrostatic capacity derived from the unsatisfactory filling is suppressed. Therefore, it becomes possible to improve capacitor capacitance by enlarging the capacitor in the vertical direction with respect to the semiconductor substrate. Therefore, the capacitor capacitance can be increased with the same occupation area in a plane parallel to the main surface of the semiconductor substrate. Therefore, even when the area occupied by the capacitor is made small, a capacitor can be formed in which malfunction such as a soft error is suppressed. As a capacitor operating correctly with small occupation area is provided, it becomes possible to provide a miniaturized semiconductor device.

Second Embodiment

The structure and the method of manufacturing a semiconductor device in accordance with the second embodiment of the present invention will be described with reference to FIGS. 10 to 16. First, the structure of the semiconductor device in accordance with the present embodiment will be described with reference to FIG. 10. The semiconductor device in accordance with the present embodiment will be described with reference to FIG. 10. The semiconductor device in accordance with the present embodiment is approximately similar to the structure of the semiconductor device in accordance with the first embodiment in the overall structure, except that impurity concentration of the interlayer oxide film 5f in which the capacitor is formed gradually increases from an upper portion to the lower portion, and that a contact hole 53 penetrating through interlayer insulating film 5f is formed as a column approximately vertical to the main surface of the semiconductor substrate 2.

Because of this structure, in the step of enlarging the opening diameter of the contact hole formed by dry etching penetrating through interlayer oxide film 5f by isotropic wet etching or the like, it becomes possible to set the etch rate of interlayer oxide film 5f in a direction approximately parallel to the main surface of semiconductor substrate 2 to be gradually smaller as it goes away from the main surface of semiconductor substrate 2.

Therefore, it is possible to gradually enlarge the opening diameter of contact hole toward semiconductor substrate 2, which contact hole is formed in the inverted frusto-conical shape in the common step of dry etching. Therefore, it becomes possible to form contact hole 53 with its opening diameter enlarged by wet etching in the shape of a column approximately vertical to the main surface of semiconductor substrate 2.

Therefore, when the capacitor is formed in contact hole 52 opened approximately in the shape of a column, unsatisfactory filling of the film to be storage electrode 8 of the capacitor caused by narrowing of the portion nearer to the contact plug 7 can be prevented. Therefore, as in the first embodiment, the semiconductor device can be miniaturized.

The method of manufacturing a semiconductor device in accordance with the second embodiment of the present invention will be described with reference to FIGS. 10 to 16. In the method of manufacturing a semiconductor device in accordance with the present embodiment, the steps similar to those of the method of manufacturing a semiconductor device in accordance with the first embodiment are performed to attain the state of FIG. 2, in which the contact plug 7 is formed. Thereafter, referring to FIG. 11, interlayer insulating film 5f of BPTEOS is deposited with boron concentration being kept constant and phosphorus concentration varied continuously to be lower as it goes away from the semiconductor substrate 2. More specifically, phosphorus concentration is gradually lowered from 8.4 mol % at the lowermost portion to 5 mol % at an uppermost portion. Thereafter, by photolithography and etching, a photoresist film of a hole shape for forming the storage electrode is formed by patterning. Using the photoresist film as a mask, contact hole 52 is formed by reactive ion etching, to expose the surface of contact plug 7, as can be seen from FIG. 12.

Thereafter, in order to enlarge the opening diameter of contact hole 52, isotropic wet etching is performed on the sidewall of contact hole 52, using buffered hydrofluoric acid. When buffered hydrofluoric acid is used, etch rate of the interlayer oxide film 5f is gradually increased from 8 nm/min at the uppermost portion to 12 nm/min at the lowermost portion. Therefore, the sidewall of contact hole 53 provided by enlarging the opening diameter of contact hole 52 becomes approximately vertical to the main surface of semiconductor substrate 2, as can be seen from FIG. 13. Thus, a contact hole 53 is provided in which the opening diameter at an upper portion and the opening diameter at a lower portion of interlayer oxide film 5f are approximately equal to each other.

After the opening diameter of contact hole 53 is enlarged, a polycrystalline silicon film 8 doped with phosphorus, which will be the storage electrode, is deposited along the upper surface of interlayer oxide film 5f and the surface of contact hole 53. Thereafter, a resist film or the like is filled in the hole formed by polycrystalline silicone film 8, which is to be the storage electrode, of a cylindrical shape in advance, so as to prevent any possible damage at the bottom portion of storage electrode caused by reactive ion etching. Thereafter, referring to FIG. 15, polycrystalline silicon film 8 deposited on the upper surface of interlayer oxide film 5f is removed by reactive ion etching, the resist film in the cylindrical hole is removed, and storage electrodes 8a and 8b are formed.

Figure 10:
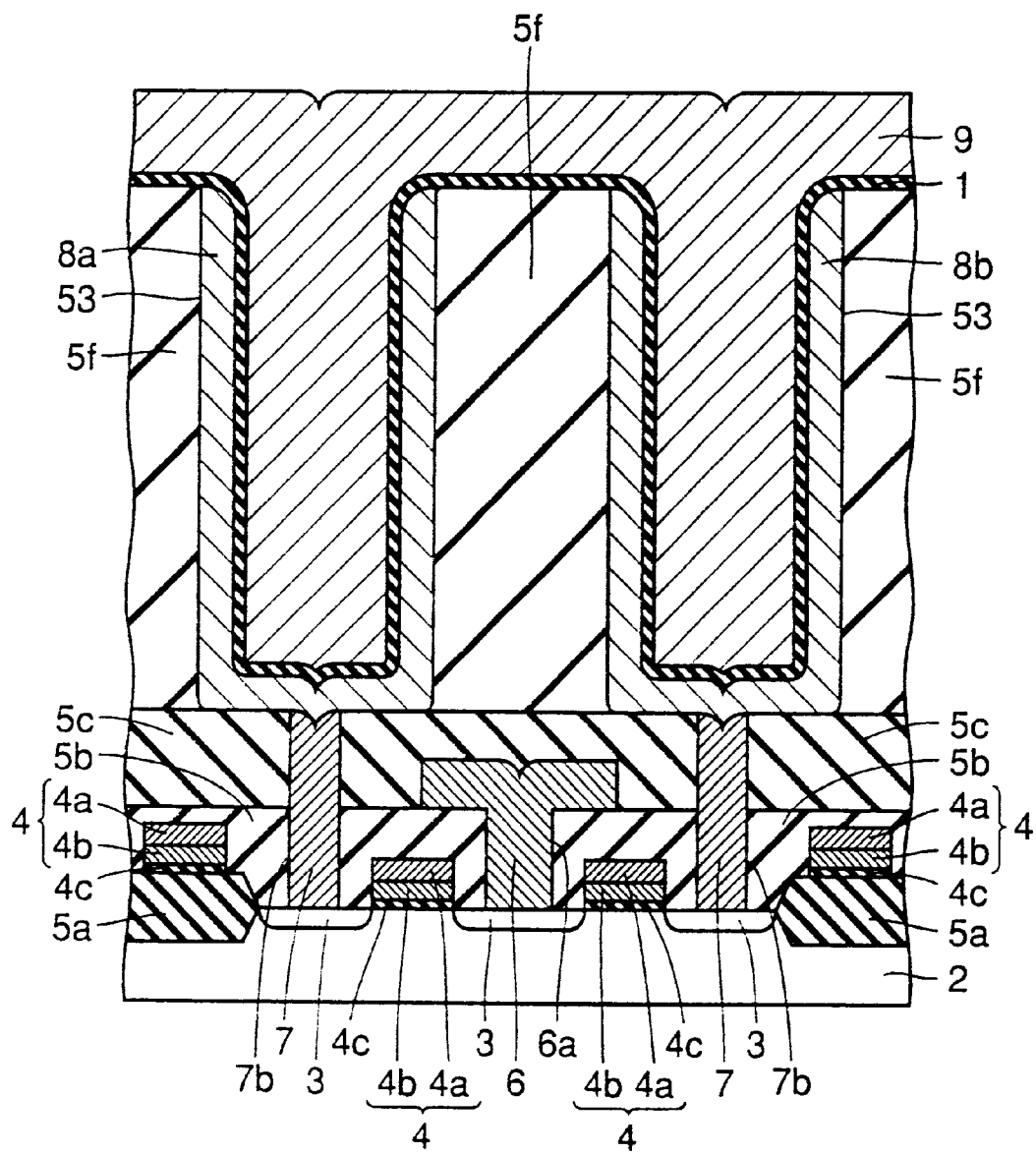
FIG. 10 is a cross sectional view representing a structure of a semiconductor device in accordance with a second embodiment of the present invention.
Figure 11:
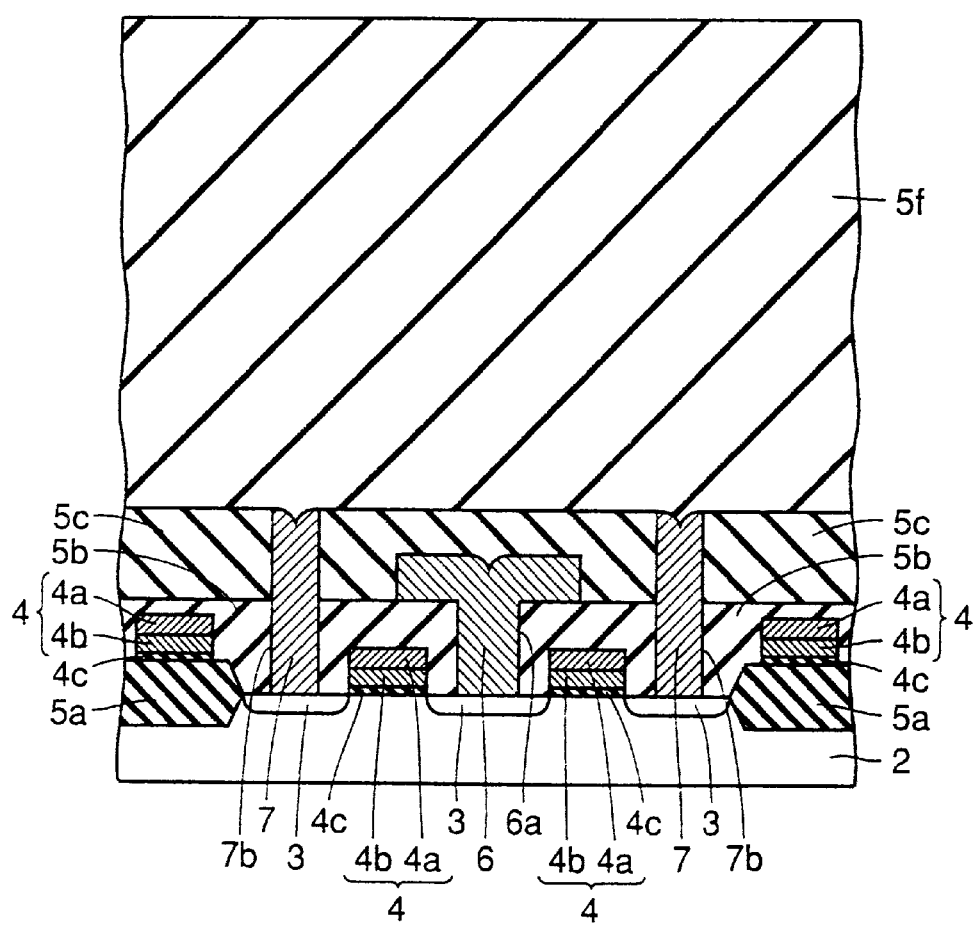
FIG. 11 is a cross sectional view showing a state immediately after an interlayer oxide film for forming a capacitor is formed to cover an interlayer oxide film in which a contact plug is formed, in the method of manufacturing a semiconductor device in accordance with the second embodiment of the present invention.
Figure 16:
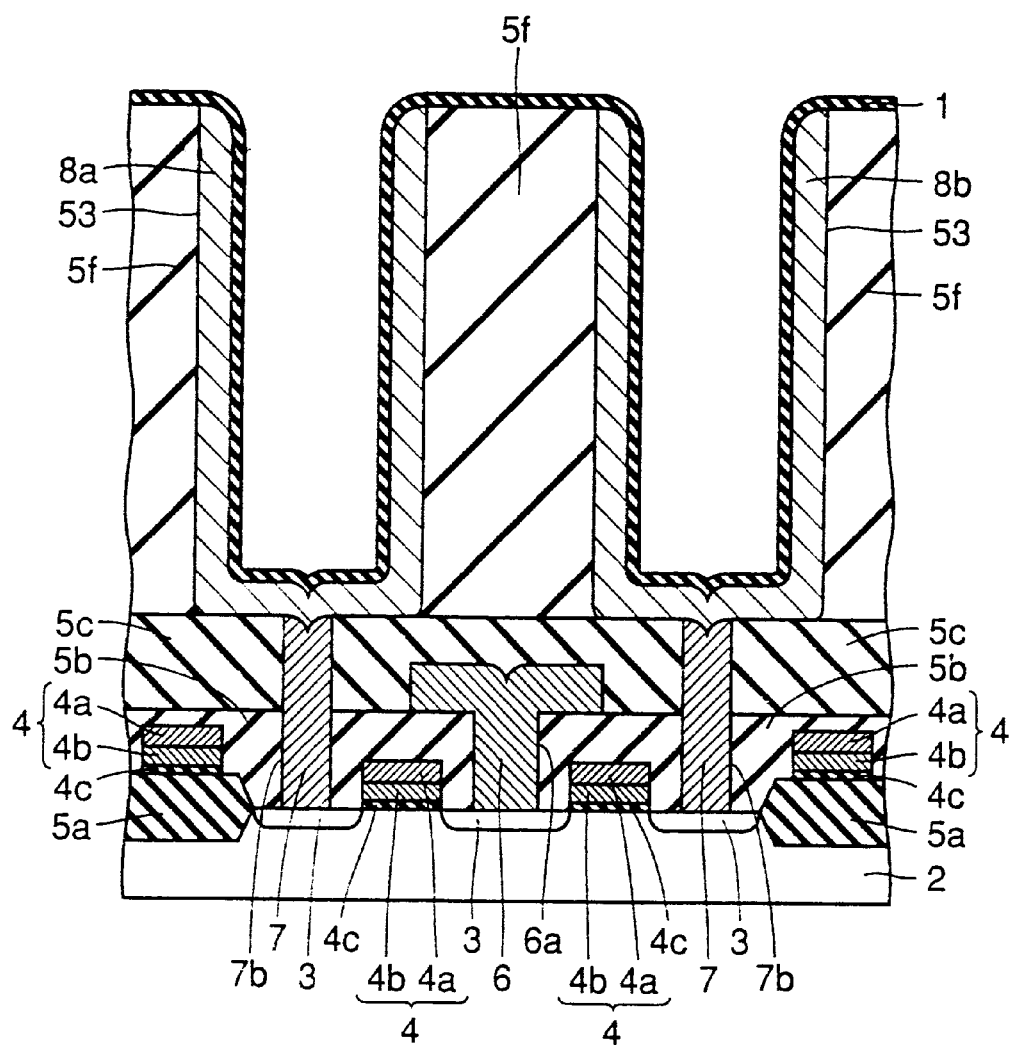
FIG. 16 is a cross sectional view showing a state immediately after a dielectric film is formed on a surface of the conductive layer to be a storage electrode and on the upper surface of the interlayer oxide film in which the capacitor is to be formed, in the method of manufacturing a semiconductor device in accordance with the second embodiment of the present invention.

Thereafter, referring to FIG. 16, a capacitor dielectric film 1 is deposited to cover storage electrodes 8a, 8b and interlayer oxide film 5f. Thereafter, as shown in FIG. 10, a cell plate electrode 9 of polycrystalline silicon film doped with phosphorus is deposited to cover the surface of capacitor dielectric film 1. In this manner, a semiconductor device having a capacitor is completed.

Figure 12:
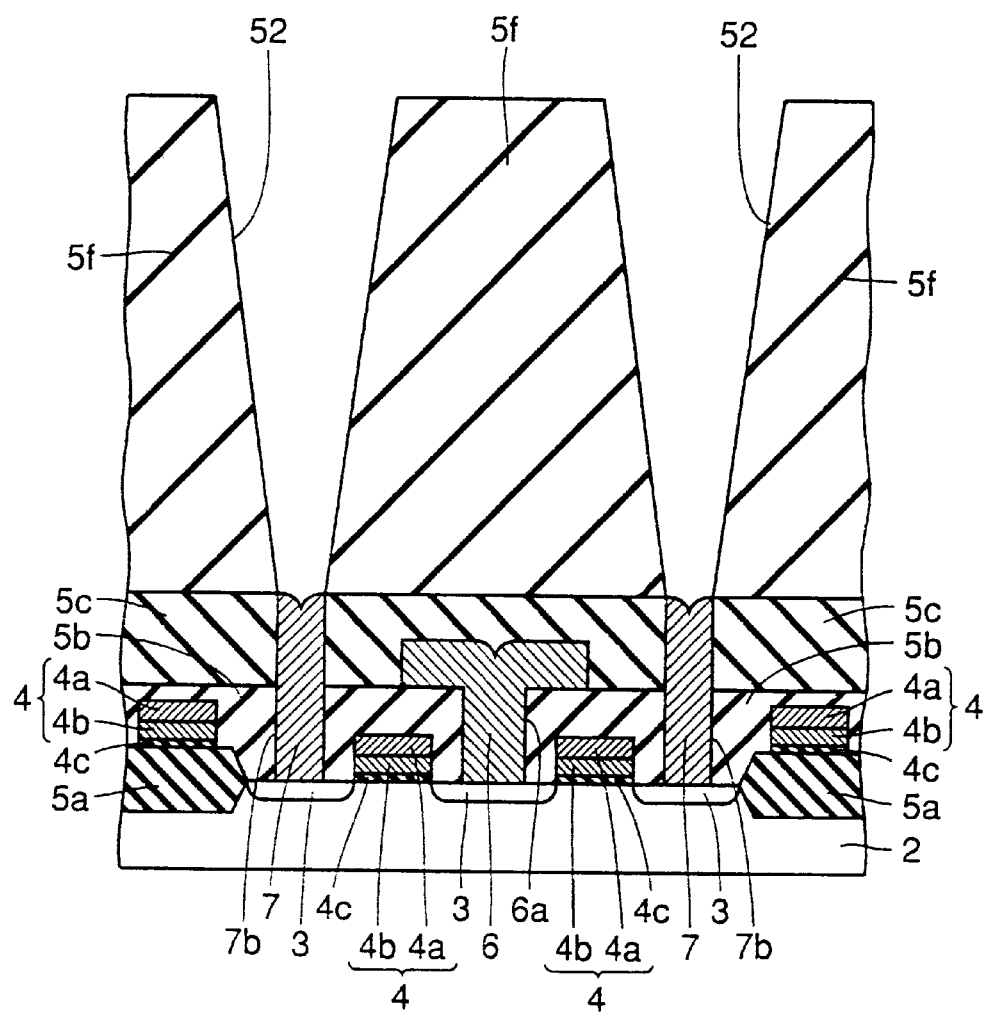
FIG. 12 is a cross sectional view showing a state immediately after a frusto-conical contact hole is formed by dry etching in the interlayer oxide film for forming a capacitor to expose the contact plug, in the method of manufacturing a semiconductor device in accordance with the second embodiment of the present invention.
Figure 13:
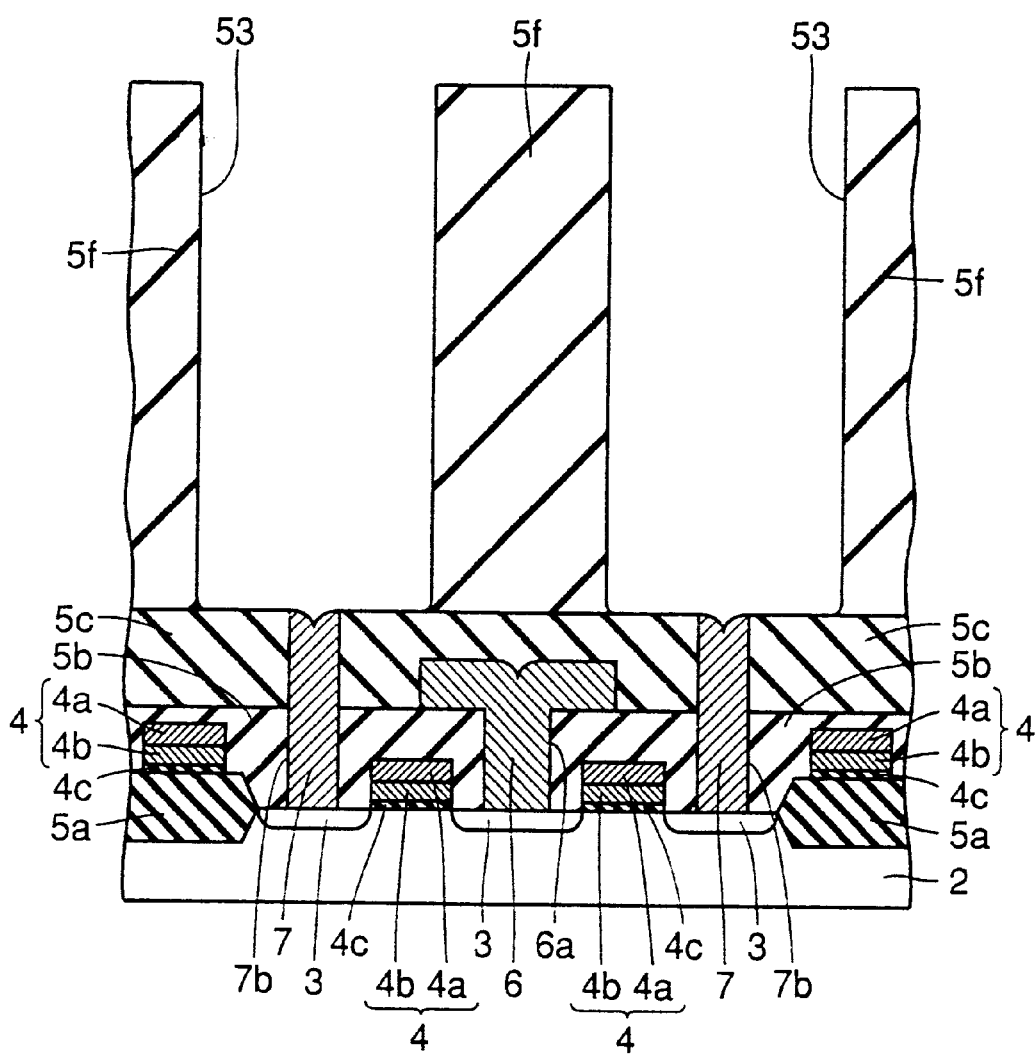
FIG. 13 is a cross sectional view showing a state immediately after the opening diameter of the contact hole is enlarged by wet etching in the method of manufacturing a semiconductor device in accordance with the second embodiment of the present invention.
Figure 14:
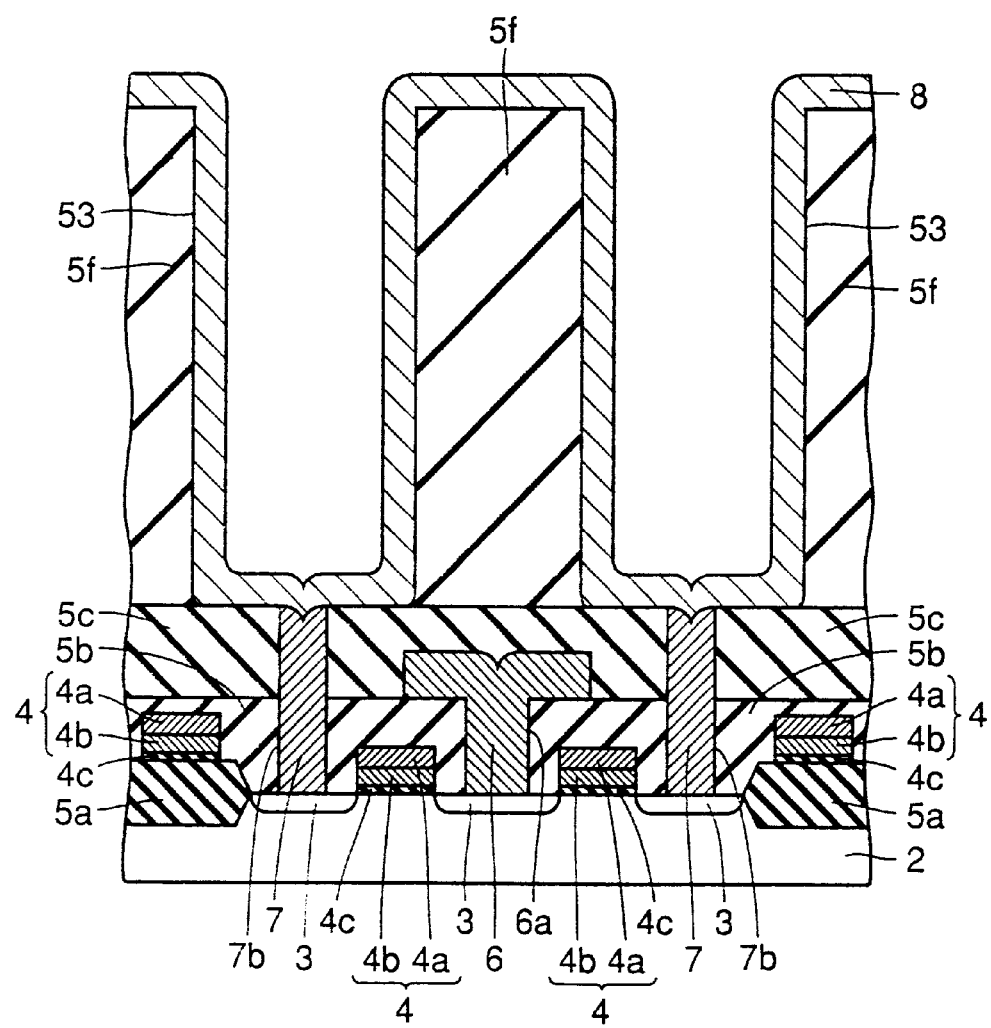
FIG. 14 is a cross sectional view showing a state immediately after a conductive layer, to be a storage electrode is formed along an inner surface of the contact hole in which the capacitor is to be formed and an upper surface of the interlayer oxide film, in the method of manufacturing a semiconductor device in accordance with the second embodiment of the present invention.
Figure 15:
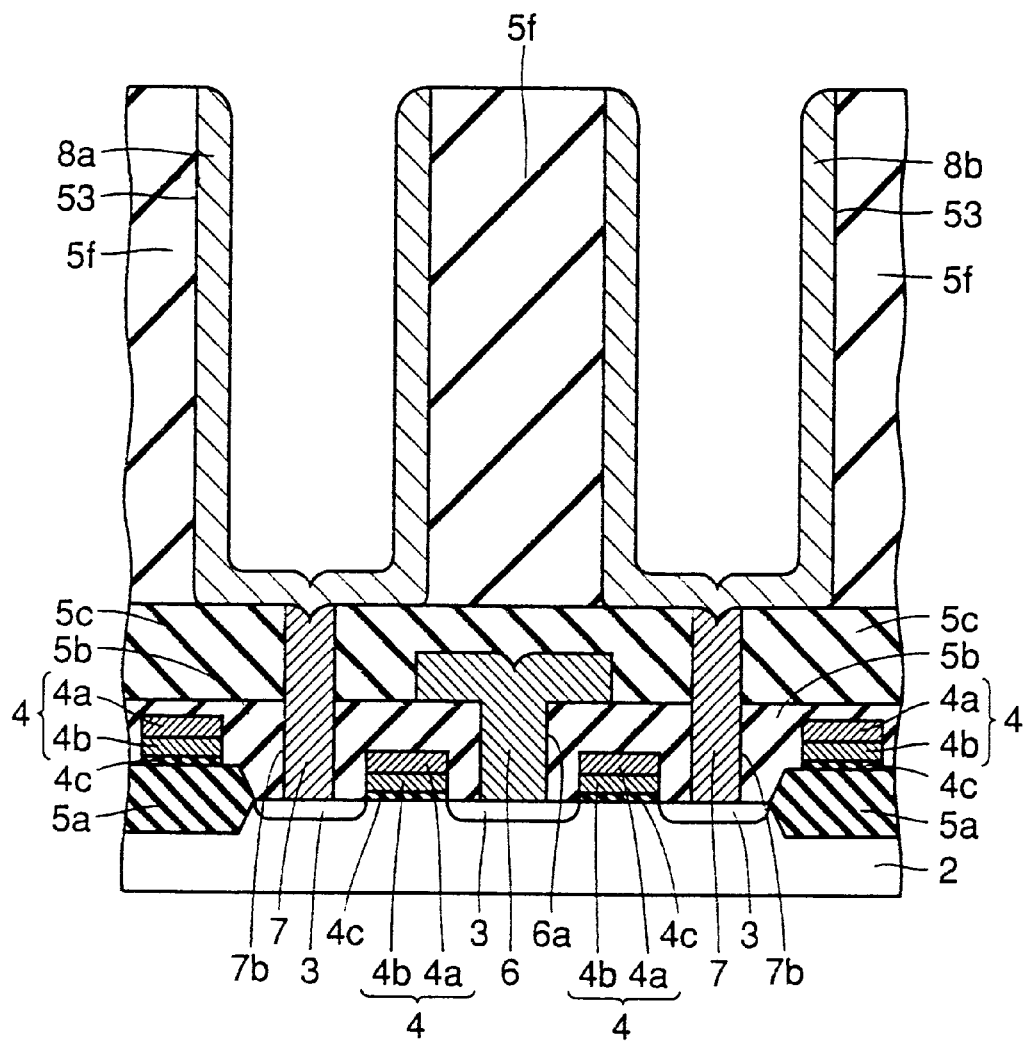
FIG. 15 is a cross sectional view showing a state immediately after the conductive layer formed on the upper surface of the interlayer oxide film in which the capacitor is formed, is removed in the method of manufacturing a semiconductor device in accordance with the second embodiment of the present invention.

By such a manufacturing method, when contact hole 52 shown in FIG. 12 formed by dry etching to penetrate through interlayer oxide film 5f is to be enlarged by wet etching or the like, it becomes possible to set etch rate of interlayer oxide film 5f in a direction approximately parallel to the main surface of semiconductor substrate 2 to be gradually decreased as it goes away from the main surface of semiconductor substrate 2. Therefore, it is possible to gradually enlarge by wet etching the opening diameter toward the semiconductor substrate 2. As a result, it becomes possible to deposit such an interlayer oxide film 5f that allows formation of a contact hole 53 in an approximately columnar shape, as shown in FIG. 13.

Therefore, in the present embodiment in which the capacitor is formed in the contact hole 53 opened in the approximately columnar shape as mentioned above, unsatisfactory filling of the film for forming the capacitor caused by the narrowing of a portion nearer to the semiconductor substrate can be prevented. Therefore, as in the semiconductor device in accordance with the first embodiment, a miniaturized semiconductor device can be provided.

Third Embodiment

Figure 17:
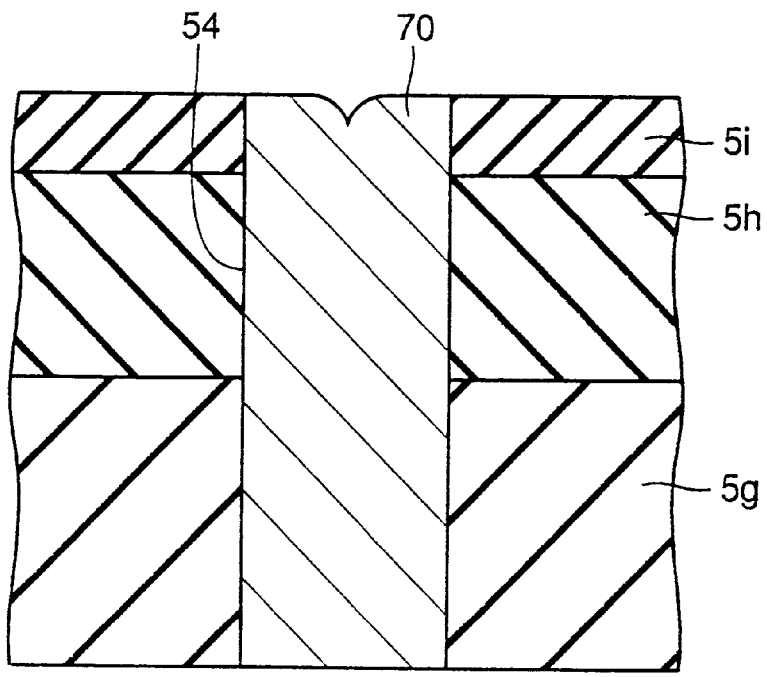
FIG. 17 is a cross sectional view representing a structure of a semiconductor device in accordance with a third embodiment of the present invention.

The structure and the manufacturing method of the semiconductor device in accordance with the third embodiment of the present invention will be described with reference to FIG. 17. First, the structure of the semiconductor device in accordance with the present embodiment will be described with reference to FIG. 17. As can be seen from FIG. 17, for the interlayer oxide film 5i deposited at an upper portion and interlayer insulating film 5g deposited at a lower portion, opening diameters formed by dry etching of which layers are expected to be smaller, BPTEOS film having phosphorus concentration of 8.4 mol % providing high isotropic wet etch rate are used, and for the interlayer oxide film 53 deposited at a middle portion of which opening diameter formed by dry etching is large, a BPTEOS film having phosphorus concentration of 5.0 mol % providing lower isotropic wet etch rate is used.

By the similar method as the methods of manufacturing semiconductor devices in accordance with the first and second embodiments described above in which anisotropic dry etching and isotropic wet etching are both used, with interlayer oxide films 5i, 5h and 5g provided as described above, it becomes possible to form a contact hole 54 penetrating through interlayer oxide films 5i, 5h and 5g to have approximately constant opening diameter with the sidewall being approximately vertical to the main surface of the semiconductor substrate. Therefore, if contact hole 54 is used as a contact hole for forming a capacitor, unsatisfactory filling of the contact hole, experienced in the bowing contact hole as described with respect to the prior art can be suppressed. When the contact hole 54 is used as a contact hole for forming the contact plug 70, sufficient opening diameter is ensured at the contact portion, and therefore it is possible to form a contact plug with low contact resistance. Further, as the portion of the interlayer oxide film 5i of contact hole 54 is made large, filling of the conductive material to form contact plug 70 is facilitated. When contact hole 54 is used as a contact hole for forming a capacitor, a capacitor having large electrostatic capacitance can be provided, as in the first and second embodiments described above.

Figure 26:
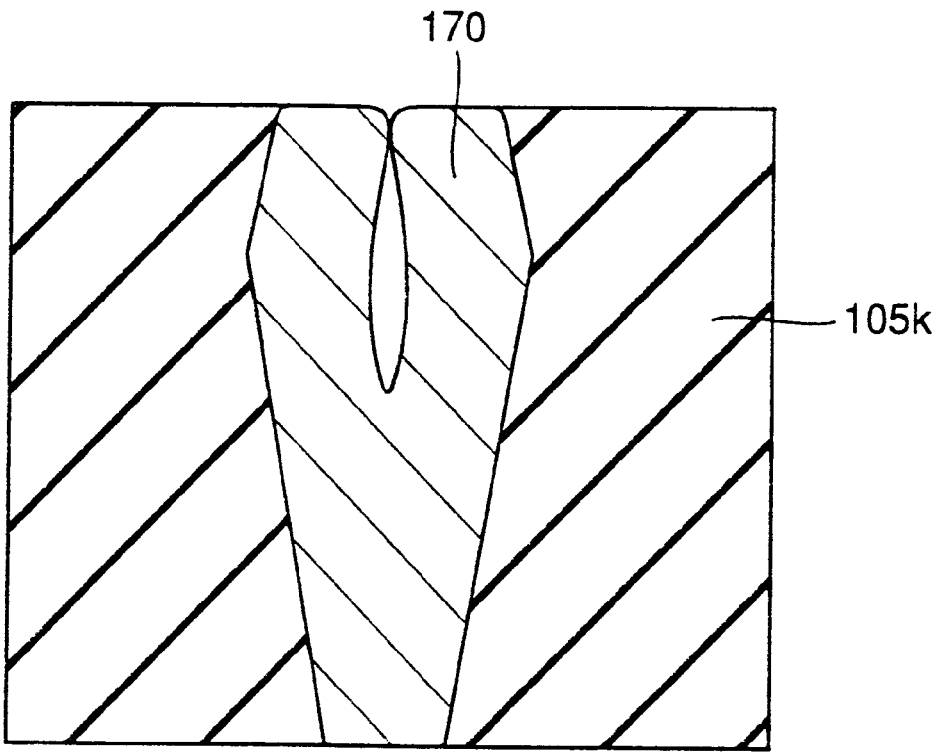
FIG. 26 is a cross sectional view showing a state where a void is formed in the contact plug, when the contact plug is filled in a contact hole formed in a bowing shape, in the conventional method of manufacturing a semiconductor device.
Figure 27:
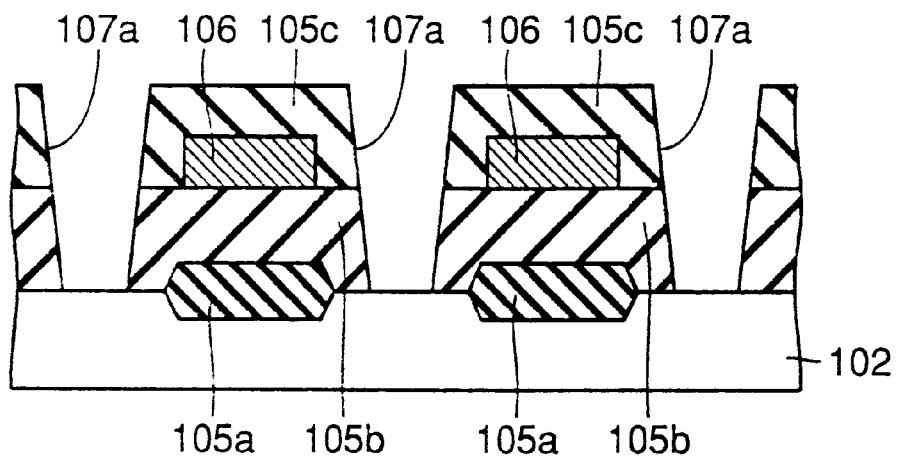
FIG. 27 is a cross sectional view showing a state viewed along the line B–B of FIG. 23, immediately after the contact hole penetrating through the interlayer oxide film and reaching the source/drain region is formed by dry etching, in the conventional method of manufacturing a semiconductor device.
Figure 28:
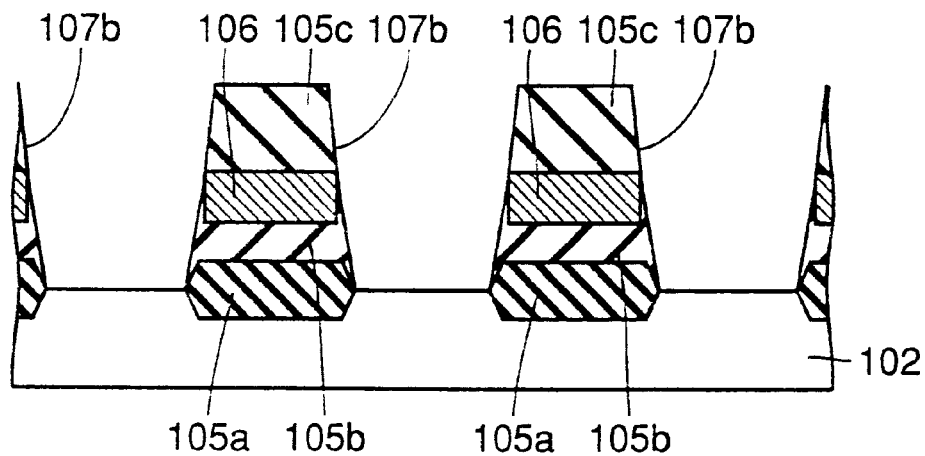
FIG. 28 is a cross sectional view showing a state immediately after an opening diameter of the contact hole formed in the interlayer oxide film and reaching the source/drain region is enlarged by wet etching, in the conventional method of manufacturing a semiconductor device.

The method of manufacturing the semiconductor device in accordance with the third embodiment of the present invention will be described with reference to FIG. 17. First, as the interlayer oxide film 5i deposited at an upper portion and interlayer insulating film 5g deposited at a lower portion, where the hole diameter is expected to be smaller, BPTEOS films having high wet etch rate and having phosphorus concentration of 8.4 mol % are deposited, and as the interlayer oxide film 5h deposited at an intermediate portion where the opening diameter of the contact hole formed by anisotropic dry etching is expected to be large, a BPTEOS film having low isotropic wet etch rate and a phosphorus concentration of 5.0 mol % is deposited. Thereafter, using a photoresist film patterned by lithography and etching as a mask, a contact hole penetrating through interlayer oxide films 5i, 5h and 5g, similar to the contact hole shown in FIG. 26, is formed in the conventional manner by reactive etching. More specifically, a contact hole in the so-called bowing shape with the wide middle portion and narrowed upper and lower portions is formed, as shown in FIG. 26. Thereafter, referring to FIG. 17, opening diameters of interlayer oxide films 5i, 5h and 5g are enlarged by isotropic wet etching at respective etch rates, so that the sidewall of contact hole 54 is made approximately vertical to the main surface of the semiconductor substrate.

By such a manufacturing method, increase in contact resistance caused by reduced contact area can be prevented, as the opening diameter of interlayer oxide film 5g reaching other conductive layer is large at the portion of interlayer oxide film 5g of the interlayer oxide films 5i, 5h and 5g of contact hole 54. Further, as the opening diameter of interlayer oxide film 5i of contact hole 54 is also large, filling of the conductive material for forming contact plug 70 is facilitated.

When the method of manufacturing contact hole 54 described above is used for forming a hole in which the capacitor is to be formed, a capacitor having large electrostatic capacitance can be formed, as in the first and second embodiments described above.

Fourth Embodiment

Figure 18:
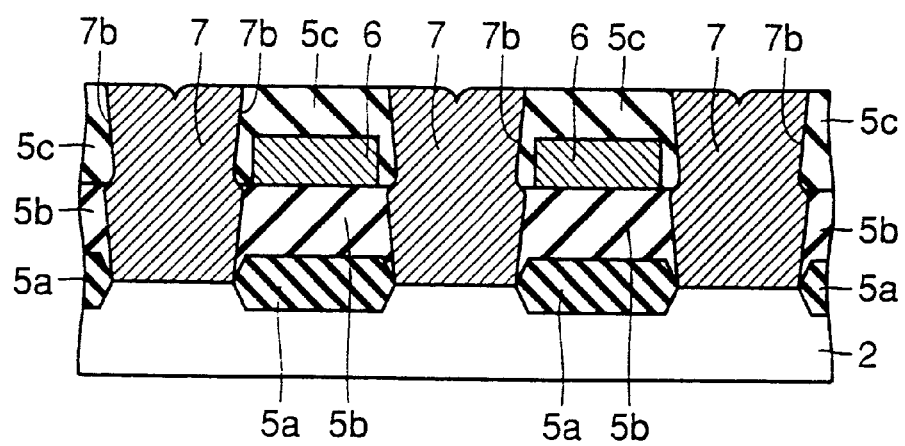
FIG. 18 is a cross sectional view representing a structure of a semiconductor device in accordance with the fourth embodiment of the present invention.

The structure and the manufacturing method of the semiconductor device in accordance with the fourth embodiment of the present invention will be described with reference to FIG. 18. First, referring to FIG. 18, the structure of the semiconductor device in accordance with the present embodiment will be described. As can be seen from FIG. 18, an isolating oxide film 5a is formed on a P type silicon substrate. In each of the element forming regions separated by isolating oxide film 5a, a gate electrode 4 (word line) of a two-layered structure including a polycrystalline silicon film 4b and a high melting point metal silicide film 4a is formed, with a gate oxide film 4c interposed. In semiconductor substrate 2, source/drain regions 3 as n⁻ diffusion layers are formed, and thus an MOSFET, that is, an MOS field effect transistor is formed. To cover gate electrode 4, source/drain region 3 and isolating oxide film 5a, an interlayer oxide film 5b which is a BPTEOS film having phosphorus concentration of 8.4 mol % is deposited on semiconductor substrate 2. A contact hole 6a reaching source/drain region 3 is formed. A contact plug is filled in contact hole 6a, thus providing a bit line 6 connected to the MOS field effect transistor. On interlayer oxide film 5b, an interlayer oxide film 5c having phosphorus concentration of 5.0 mol % is formed, and a contact hole 7b of a shape having two inverted frusto-cones continued in the vertical direction, is formed, reaching the storage electrode of the capacitor. A contact plug 7 is formed by filling a conductive material in contact hole 7b.

Because of this structure, the contact area between contact plug 7 and source/drain region 3 is enlarged, as the bottom portion of contact hole 7b in which contact plug 7 is formed is much enlarged by isotropic wet etching. Further, at the upper portion of contact hole 7b, opening diameter is not excessively enlarged, and therefore the contact hole is not so close as to electrically affect the bit line 6. As a result, short circuit between contact plug 7 and bit line 6 at the side surface of contact plug 7 can be prevented, while contact resistance between contact plug 7 and source/drain region 3 can be reduced.

Figure 19:
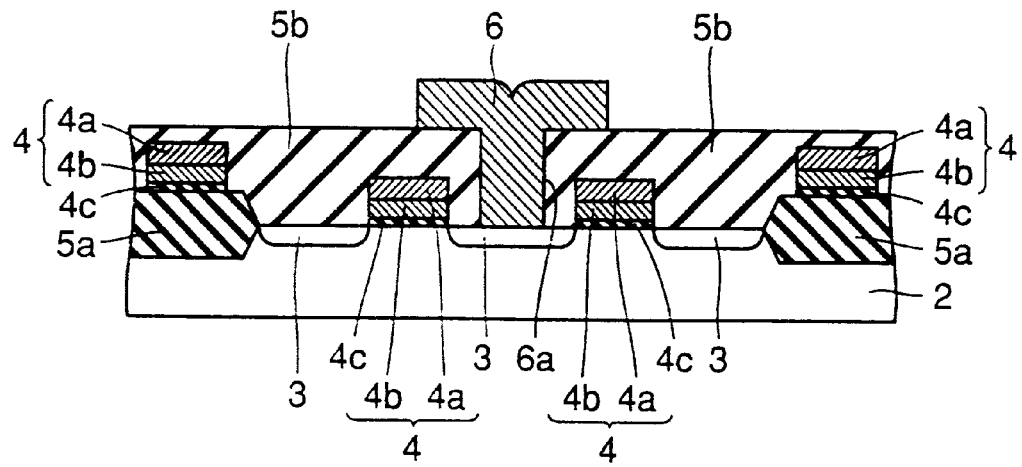
FIG. 19 is a cross sectional view showing a state immediately after a bit line penetrating through the interlayer oxide film and reaching a source/drain region is formed, in the method of manufacturing a semiconductor device in accordance with the fourth embodiment of the present invention.

The method of manufacturing the semiconductor device in accordance with the fourth embodiment of the present invention will be described with reference to FIGS. 19 to 21. First, the isolating oxide film 5a is formed on P type silicon substrate 2. Then, in the element forming region separated by isolating oxide film 5a, gate oxide film 4c and gate electrode 4 (word line) including two-layered structure including high melting point metal silicide film 4a and polycrystalline silicon film 4b are formed. Thereafter, from the main surface to a prescribed depth of semiconductor substrate 2, source/drain regions 3, which are n⁻ diffusion layers, are formed by impurity implantation, and in this manner, an MOSFET, that is, an MOS field effect transistor is formed.

Thereafter, interlayer oxide film 5b of BPTEOS having phosphorus concentration of 8.4 mol % is deposited to cover source/drain region 3, gate electrode 4 and isolating oxide film 5a. Thereafter, a contact hole 6a connected to source/drain region 3 is formed. Thereafter, a contact plug is filled in contact hole 6a and etched to a prescribed shape. Thus, as shown in FIG. 19, a bit line 6 is formed. Thereafter, interlayer oxide film 5c of BPTEOS having phosphorus concentration of 5.0 mol % is deposited to cover interlayer oxide film 5b and bit line 6.

Figure 20:
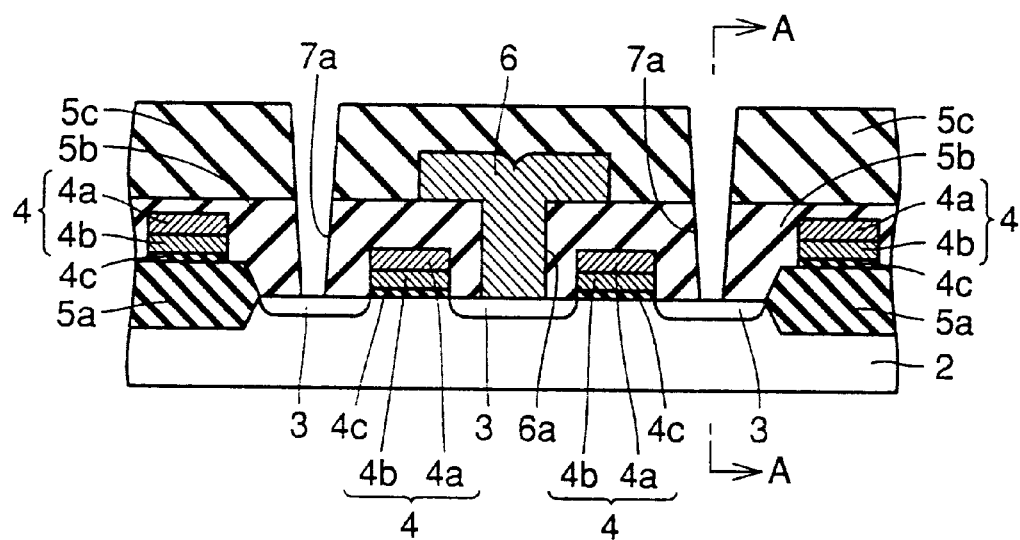
FIG. 20 is a cross sectional view showing a state immediately after a contact hole penetrating the interlayer oxide film and reaching source/drain region is formed by dry etching, in the method of manufacturing a semiconductor device in accordance with a fourth embodiment of the present invention.
Figure 21:
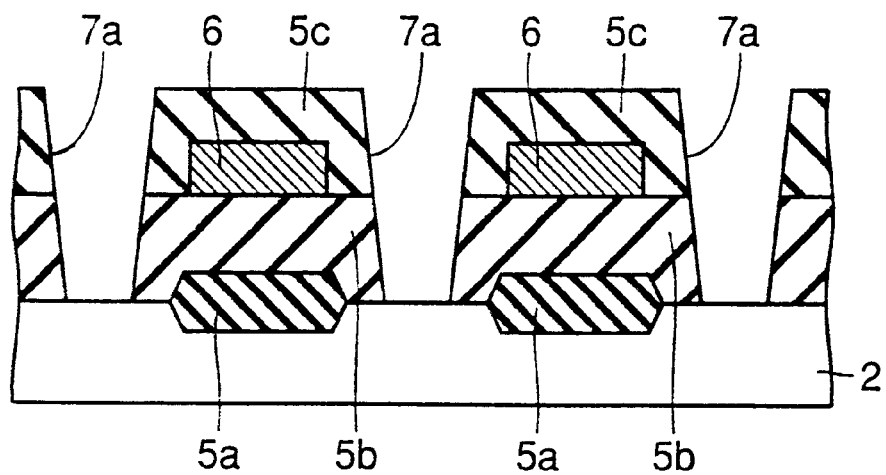
FIG. 21 is a cross sectional view taken along the line A–A of FIG. 20 showing the state immediately after the bit line penetrating through the interlayer oxide film and reaching a source/drain region is formed, in the method of manufacturing a semiconductor device in accordance with the fourth embodiment of the present invention.
Figure 22:
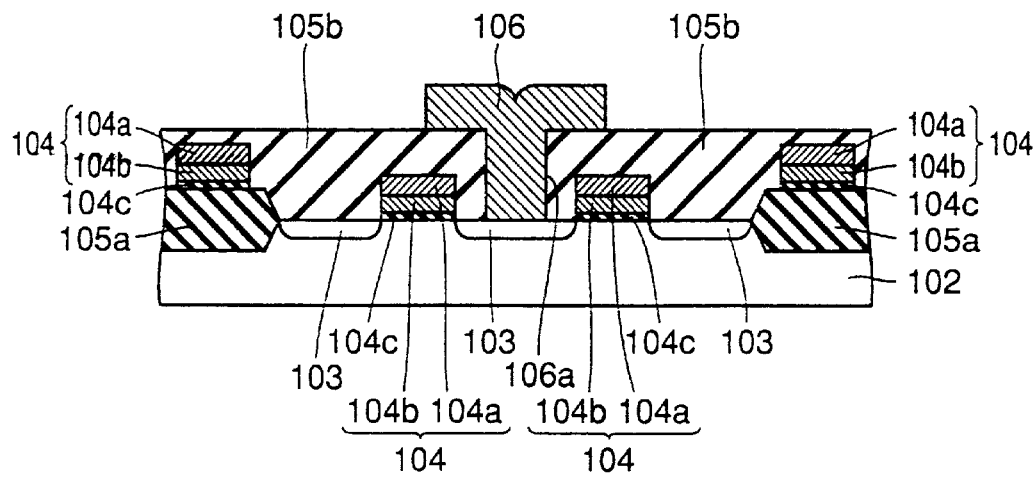
FIG. 22 is a cross sectional view showing a state immediately after a contact plug to be connected to the source/drain region is filled in the contact hole formed in the interlayer oxide film by dry etching and a bit line is formed, in the conventional method of manufacturing a semiconductor device.
Figure 23:
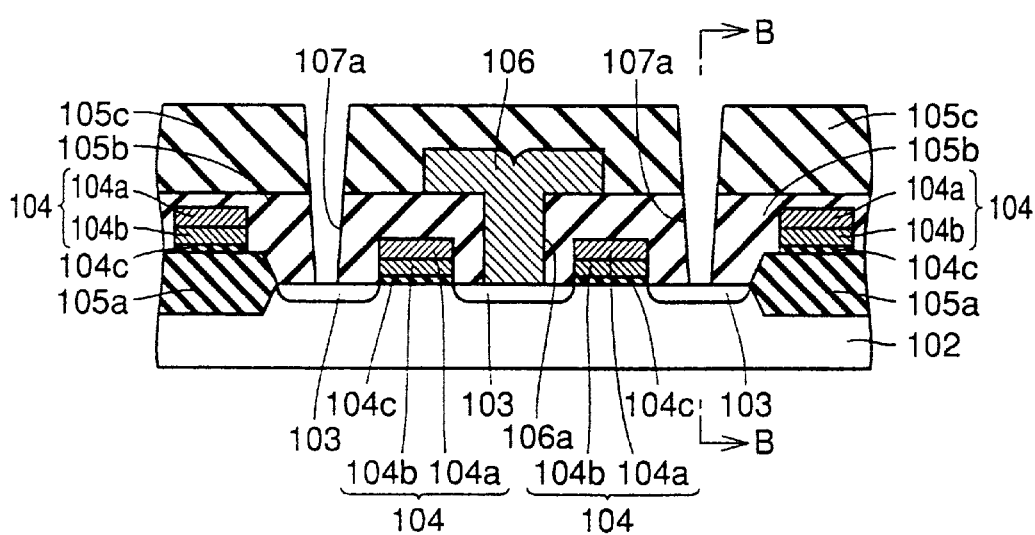
FIG. 23 is a cross sectional view showing a state immediately after a contact hole penetrating through the interlayer oxide film and reaching a source/drain region is formed by dry etching, in the conventional method of manufacturing a semiconductor device.
Figure 24:
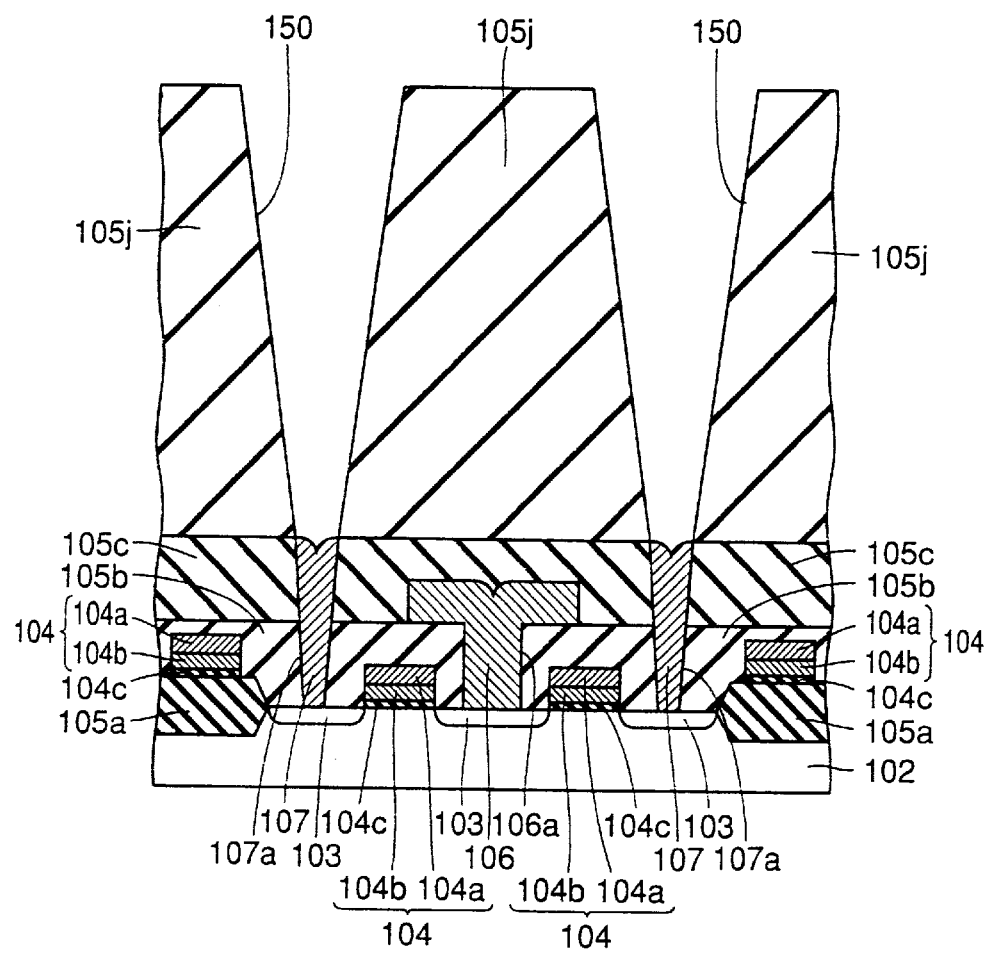
FIG. 24 is a cross sectional view showing a state immediately after a contact hole is formed in the interlayer oxide film in which a capacitor is to be formed, by dry etching, to expose a surface of the contact plug, in the conventional method of manufacturing a semiconductor device.
Figure 25:
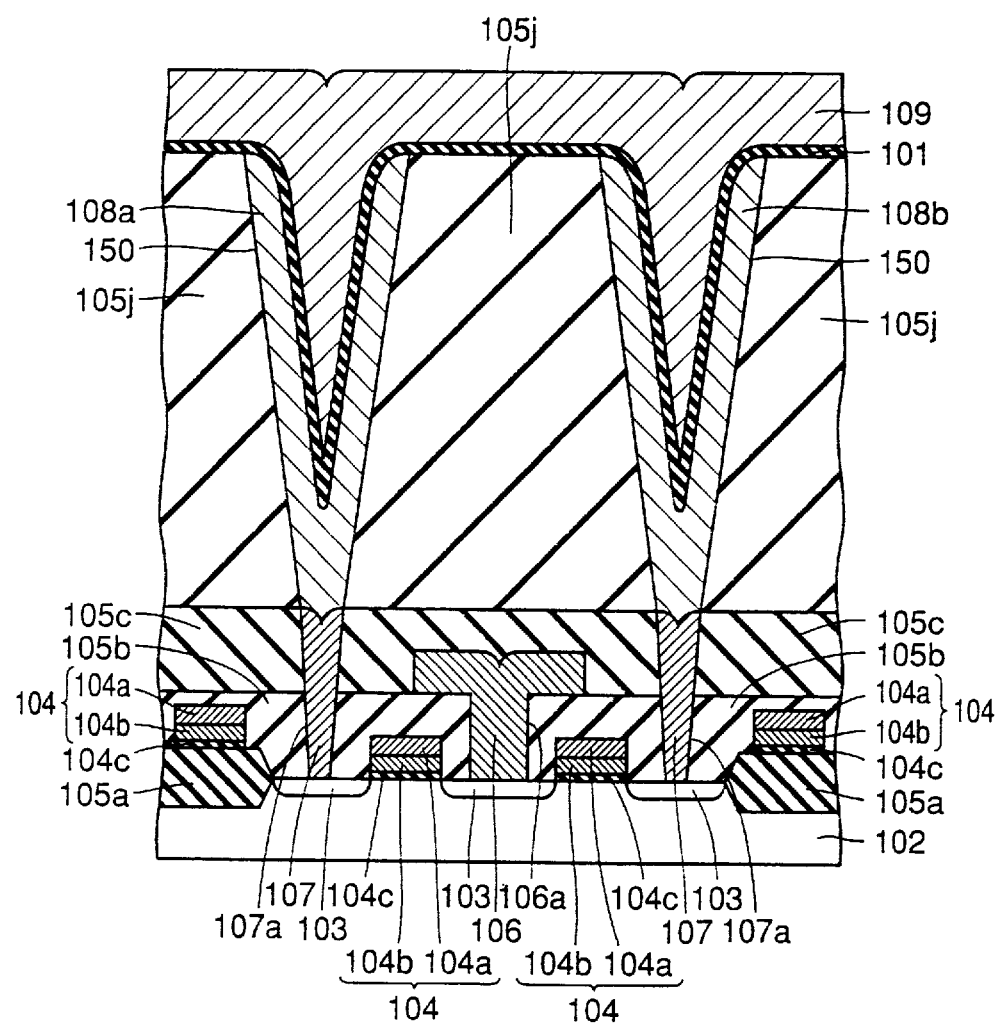
FIG. 25 is a cross sectional view representing a structure of a conventional semiconductor device having a capacitor.

Thereafter, using a photoresist formed by photolithography and etching as a mask, a contact hole 7a penetrating through interlayer oxide films 5b and 5c and reaching source/drain region 3 is formed, to attain the state of FIG. 20 and FIG. 21, which is a cross section taken along the line A—A of FIG. 20. Thereafter, when isotropic wet etching is performed, the portion of interlayer oxide film 5b of contact hole 7a has its opening diameter enlarged by larger amount, as it has higher wet etch rate than interlayer oxide film 5c. Therefore, contact hole 7a shown in FIG. 21 comes to have such a shape of contact hole 7b as shown in FIG. 22, in which only the opening diameter of interlayer oxide film 5b is enlarged, that is, a shape in which two inverted frusto-cones continue in the vertical direction.

In accordance with such a manufacturing method, the interlayer oxide film 5c at the upper portion of contact hole 7b has its opening diameter not excessively enlarged, and therefore short-circuit between bit line 6 and contact plug 7 is avoided. Further, as the opening diameter of interlayer oxide film 5c which is at the bottom portion of contact hole 7b where contact plug 7 is formed is enlarged, contact area between contact plug and source/drain region 3 can be enlarged. Therefore, the short-circuit between contact plug 7 and bit line 6 is prevented, while contact resistance between contact plug 7 and source/drain region 3 can be reduced.

Though BPTEOS film containing an impurity has been described in the first to fourth embodiments above, an interlayer oxide film formed of PTEOS film, BTEOS film or an interlayer oxide film containing impurities of an arbitrary combination of phosphorus or boron and other material may be used, provided that the interlayer oxide film contains an impurity allowing variation of etch rate. allowing variation of etch rate.

Though a TEOS film is used as an interlayer oxide film not containing impurity in the first to fourth embodiments above, an NSG (Non Doped Silicate Glass) film or the like not doped with any impurity may be used in place of the TEOS film.

Further, though wet etching has been described as an example of isotropic etching in the first to fourth embodiments above, the amount of enlargement of the opening diameter of the contact hole may be differentiated by dry etching, provided that the etching is isotropical.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate; and an insulating film having an upper portion and containing an impurity formed in said semiconductor substrate, with an impurity concentration distribution such that an average wet isotropic etch rate in the lower portion is higher than the average wet isotropic etch rate in the upper portion.

2. The semiconductor device according to claim 1, wherein said insulating film includes:

a first insulating film constituting the lower portion and having a first impurity, and a second insulating film, constituting the upper portion, formed on said first insulating film and having a second impurity of lower impurity concentration than the impurity concentration of said first insulating film.

3. The semiconductor device according to claim 2, further comprising a third insulating film formed on said second insulating film, and having a higher impurity concentration than the impurity concentration of said second insulating film, such that the wet isotropic etch rate of the third insulating film is greater than that of the second insulating film.

4. The semiconductor device according to claim 1, wherein impurity concentration distribution of said insulating film is set such that the impurity concentration gradually decreases from the upper portion to the lower portion.

5. The semiconductor device according to claim 1, wherein said impurity includes at least one of boron and phosphorus.

6. The semiconductor device according to claim 1, wherein a hole penetrating the insulating film is formed in said insulating film.

7. The semiconductor device according to claim 6, wherein a capacitor is formed along an internal peripheral surface of said hole.

8. The semiconductor device according to claim 6, wherein a contact plug is formed to fill said hole.

9. The semiconductor device according to claim 1, wherein said insulating film includes a silicon oxide film.

10. The semiconductor device according to claim 9, wherein said silicon oxide film is of a TEOS film.

11. A method of manufacturing a semiconductor device, comprising the step of forming, on a semiconductor substrate, an insulating film having an upper portion and a lower portion and containing an impurity with an impurity concentration distribution such that an average wet isotropic etch rate in the lower portion is higher than the average wet isotropic etch rate in the upper portion.

12. The method of manufacturing a semiconductor device according to claim 11, wherein said step of forming an insulating film includes the steps of forming a first insulating film constituting the lower portion and having a first impurity on said semiconductor substrate, and forming a second insulating film, consisting the upper portion having a second impurity of higher impurity concentration than the impurity concentration of said first insulating film, on said first insulating film.

13. The method of manufacturing a semiconductor device according to claim 12, wherein said step of forming said insulating film further includes the step of forming a third insulating film having a third impurity of higher impurity concentration than the impurity concentration of said second insulating film, on said second insulating film, such that the wet isotropic etch rate of the third insulating film is greater than that of the second insulating film.

14. The method of manufacturing a semiconductor device according to claim 11, wherein said step of forming said insulating film includes the step of adding an impurity such that the impurity concentration gradually decreases from the upper portion to the lower portion.

15. The method of manufacturing a semiconductor device according to claim 11, wherein said impurity includes at least one of boron and phosphorus.

16. The method of manufacturing a semiconductor device according to claim 11, further comprising the step of forming a hole penetrating through the insulating film, in said insulating film.

17. The method of manufacturing a semiconductor device according to claim 16, further comprising the step of forming a capacitor along a side surface of said hole.

18. The method of manufacturing a semiconductor device according to claim 16, further comprising the step of forming a contact plug to fill said hole.

19. The method of manufacturing a semiconductor device according to claim 11, wherein said insulating film is a silicon oxide film.

20. The method of manufacturing a semiconductor device according to claim 19, wherein said silicon oxide film is of a TEOS film.

21. The semiconductor device according to claim 4, wherein the average wet isotropic etch rate gradually increases from the upper portion to the lower portion.

22. The method according to claim 14, wherein the average wet isotropic etch rate gradually increases from the upper portion to the lower portion.

* * * * *

UNITED STATES PATENT AND TRADEMARK OFFICE
CERTIFICATE OF CORRECTION

PATENT NO. : 6,215,187 B1  
DATED : April 10, 2001  
INVENTOR(S) : Kenichi Ooto, et al.

Page 1 of 1

It is certified that error appears in the above-identified patent and that said Letters Patent is hereby corrected as shown below:

<u>Title page,</u>
Under "(73) Assignee", after "Tokyo (JP)", add -- Ryoden Semiconductor System Engineering Corporation, Hyogo (JP)

Signed and Sealed this

Twenty-fifth Day of September, 2001

Attest:

NICHOLAS P. GODICI

*Attesting Officer*   *Acting Director of the United States Patent and Trademark Office*